US011223380B2

(12) United States Patent
Hode

(10) Patent No.: US 11,223,380 B2
(45) Date of Patent: Jan. 11, 2022

(54) METHOD FOR FILTERING WITH ZERO LATENCY AND ASSOCIATED DEVICES

(71) Applicant: THALES, Courbevoie (FR)

(72) Inventor: Jean-Michel Hode, Merignac (FR)

(73) Assignee: THALES, Courbevoie (FR)

( * ) Notice: Subject to any disclaimer, the term of this patent is extended or adjusted under 35 U.S.C. 154(b) by 0 days.

(21) Appl. No.: 17/071,760

(22) Filed: Oct. 15, 2020

(65) Prior Publication Data
US 2021/0119655 A1 Apr. 22, 2021

(30) Foreign Application Priority Data

Oct. 16, 2019 (FR) ...................................... 1911525

(51) Int. Cl.
*H04B 1/12* (2006.01)
(52) U.S. Cl.
CPC ..................................... *H04B 1/12* (2013.01)
(58) Field of Classification Search
CPC ......... H04B 1/12; G01S 7/288; G01S 7/2921; G01S 7/2883; H03H 2017/0247; H03H 17/0213; H03H 17/0238; H03H 17/0264; G06F 17/41
See application file for complete search history.

(56) References Cited

U.S. PATENT DOCUMENTS

| 7,502,816 B2 * | 3/2009 | Kumamoto | ........... G06F 17/156 708/405 |
| 2006/0140291 A1 * | 6/2006 | Thomas, Jr. | .......... H04L 27/265 375/260 |
| 2017/0317663 A1 * | 11/2017 | Zhuang | .................. G06F 17/14 |
| 2019/0268202 A1 * | 8/2019 | Levinbook | .......... H04L 27/2602 |

FOREIGN PATENT DOCUMENTS

| FR | 3049131 A1 | 9/2017 |
| WO | WO 2007/100666 A2 | 9/2007 |

OTHER PUBLICATIONS

French Search Report issued by the French Patent Office for corresponding French Patent Application No. FR1911525, dated Jul. 16, 2020.

* cited by examiner

*Primary Examiner* — Dac V Ha
(74) *Attorney, Agent, or Firm* — Arent Fox LLP

(57) ABSTRACT

The invention relates to a method for filtering a numerical input signal sampled at a sampling frequency in order to obtain a filtered signal, the method including at least one step for:

obtaining a first (respectively second) output signal by carrying out first (respectively second) operations on the first (respectively second) processing channel, the first (respectively second) operations including at least the application of a discrete Fourier transform to $M/2^p$ points on a signal coming from the input signal, the integer p being greater than or equal to 1, applying an inverse discrete Fourier transform to $M/2^p$ points on the first signal in order to obtain M points of the spectrum of the first signal, M being an integer strictly greater than 2, the application step being carried out by the addition of the results of two processing channels.

8 Claims, 14 Drawing Sheets

METHOD FOR FILTERING WITH ZERO LATENCY AND ASSOCIATED DEVICES

This patent application claims the benefit of document FR 19/11525 filed on Oct. 16, 2019, which is hereby incorporated by reference.

FIELD OF THE INVENTION

The present invention relates to a method for filtering a numerical input signal. The present invention also relates to an associated filter, processing chain and radar.

BACKGROUND OF THE INVENTION

For multiple applications in the field of radars, it is desirable to filter a digitized signal with a specific transfer function.

To that end, filters of the finite impulse response type are often used. Such filters are often referred to using the acronym FIR, per the accepted English terminology. FIR filters carry out operations comprising the use of time shifts of the signal, gains and summation. The number of operations is equal to the length of the impulse response of the considered FIR filter (the length being expressed in number of samples).

However, when the length of the impulse response of the filter is very large, as is the case for the pulse compression involved in the radars, the performance of the filtering becomes problematic, if not impossible, in light of the very large number of operations involved.

In order to circumvent such a problem, it is known to perform some operation in the space of frequencies. To this end, a Fourier transform is applied to go from the time domain to the frequency domain, the filter operation then becoming multiplicative, then a Fourier transform is next applied in order to return to the time domain.

In practice, the time is divided into sequences and the Fourier transform is implemented through a Fast Fourier Transform, often referred to using the acronym FFT. More specifically, the passage from the domain of the time space to the frequency space is obtained by using a FFT, while the passage from the domain of the frequency space to the time space is obtained by using an IFFT. The acronym IFFT refers to "Inverse Fast Fourier Transform".

The use of Fourier transforms, whether inverse fast or not, involves a size at least equal to the length of the filter. Indeed, if the size of the Fourier transform, whether inverse fast or not, is strictly equal to the size K of the filter, then the process only makes it possible to obtain a single point on K, the K−1 other calculated points not being usable. If the size of the Fourier transform, whether inverse fast or not, is strictly equal to two times the size K of the filter, or 2K, then the process makes it possible to obtain K points on 2K, the K other calculated points not being usable. Thus, by doubling the process, it is possible to calculate 2 times K points on 2K and to access all of the required points.

However, this shows that half of the calculated points are lost, which increases the computational load and complicates the implementation of the filter.

SUMMARY OF THE INVENTION

There is therefore a need for a method for filtering a numerical input signal that is easier to implement.

To that end, described is a method for filtering a numerical input signal sampled at a sampling frequency in order to obtain a filtered signal, the method including at least one step for providing an input signal, a step for transmission of the input signal over two processing channels, a step for obtaining a first output signal through the implementation of first operations on the first processing channel, the first operations including at least the application of a discrete Fourier transform to $M/2p$ points on a signal coming from the input signal, the integer p being greater than or equal to 1, a step for obtaining a second output signal through the implementation of second operations on the second processing channel, the second operations including at least the application of a shift by $M/2$ points to a signal coming from the input signal, then the application of a discrete Fourier transform to $M/2^p$ points on the shifted signal and a step for applying an inverse discrete Fourier transform to $M/2^p$ points on the first signal in order to obtain M points of the spectrum of the first signal, M being an integer strictly greater than 2, the application step being carried out by the addition of the results of two processing channels.

Also described is a method for filtering a numerical input signal sampled at a sampling frequency in order to obtain a filtered signal, the method including at least one step for providing an input signal, a step for transmission of the input signal over two processing channels, a step for obtaining a first output signal through the implementation of first operations on the first processing channel, the first operations including at least the application of a filtering involving a discrete Fourier transform to $M/2$ points on a signal coming from the input signal, the filtering having a latency of M, a step for obtaining a second output signal through the implementation of second operations on the second processing channel, the second operations including at least the application of a shift by $M/2$ points to a signal coming from the input signal, then the application of filtering involving a discrete Fourier transform to $M/2$ points on the shifted signal, the filtering having a latency of M, a step for applying an inverse discrete Fourier transform to $M/2$ points on the first signal in order to obtain M points of the spectrum of the first signal, M being an integer strictly greater than 2, and a step for recombination of the results of two processing channels.

According to specific embodiments, the filtering method includes one or more of the following features, considered alone or according to any technically possible combinations:
- the method includes carrying out at least the step for application of a plurality of values of p.
- the integer p is less than or equal to the integer $p_0$, the integer $p_0$ being an integer verifying $M/2^{p_0}=1$.
- the integer p increases by increments of 1.
- the first operations include first processing of the input signal in order to obtain a processed signal, an operation for implementation of the step for application of a discrete Fourier transform to M points on the first signal of the filtering method as previously described, the first signal being the processed signal, each point of the spectrum of the processed signal corresponding to the even indices of a spectral analysis at 2*M points of the processed signal and being identified in a bijective manner by an index k, k being an even number inclusively between 0 and 2*M−1, second processing of the points of the spectrum of the processed signal in order to obtain the first selected points, an application of the inverse discrete Fourier transform to M points on the first selected points in order to obtain a first signal, and third processing of the first signal in order to obtain a first output signal.

the second operations include first processing of the input signal in order to obtain a processed signal, an operation for implementation of the step for application of a discrete Fourier transform to M points on the first signal of the filtering method as previously described, the first signal being the processed signal, each point of the spectrum of the processed signal corresponding to the odd indices of a spectral analysis at 2*M points of the processed signal and being identified in a bijective manner by an index k, k being an even number inclusively between 0 and 2*M−1, second processing of the points of the spectrum of the processed signal in order to obtain the first selected points, an application of the inverse discrete Fourier transform to M points on the second selected points in order to obtain a first signal, and third processing of the second signal in order to obtain a first output signal.

the method includes an operation for addition of an input signal and of the input signal shifted by N/2 points, the signal obtained after addition being the input signal of the first processing channel.

the method includes an operation for addition of an input signal and of the input signal shifted by N points, the signal obtained after addition being the input signal of the second processing channel.

the operation for shifting by N points is applied using two sub-units.

the first operations include first processing of the input signal in order to obtain a processed signal, an operation for implementation of the step for application of a discrete Fourier transform to M points on the first signal of the filtering method as previously described, the first signal being the processed signal, each point of the spectrum of the processed signal corresponding to the even indices of a spectral analysis at 2*M points of the processed signal and being identified in a bijective manner by an index k, k being an even number inclusively between 0 and 2*M−1, second processing of the points of the spectrum of the processed signal in order to obtain the first selected points, an application of the inverse discrete Fourier transform to M points on the first selected points in order to obtain a first signal, and third processing of the first signal in order to obtain a first output signal.

the second operations include first processing of the input signal in order to obtain a processed signal, an operation for implementation of the step for application of a discrete Fourier transform to M points on the first signal of the filtering method as previously described, the first signal being the processed signal, each point of the spectrum of the processed signal corresponding to the odd indices of a spectral analysis at 2*M points of the processed signal and being identified in a bijective manner by an index k, k being an even number inclusively between 0 and 2*M−1, second processing of the points of the spectrum of the processed signal in order to obtain the first selected points, an application of the inverse discrete Fourier transform to M points on the second selected points in order to obtain a first signal, and third processing of the second signal in order to obtain a first output signal.

the method comprises providing an input signal, transmitting the input signal over two channels, obtaining a first output signal by carrying out the following first operations on the first channel and obtaining a second output signal by carrying out the following second operations on the second channel. The obtainment of a first output signal by carrying out the following first operations on the first channel: a first operation for first processing of the input signal in order to obtain a processed signal, a first operation for application of a discrete Fourier transform to M points on the processed signal to obtain M points of the spectrum of the processed signal, M being an integer strictly greater than 2, of the filtering method as previously described, the first signal being the processed signal, each point of the spectrum of the processed signal corresponding to the even indices of a spectral analysis at 2*M points of the processed signal and being identified in a bijective manner by an index k, k being an even number inclusively between 0 and 2*M−1, a first operation for second processing of the points of the spectrum of the processed signal in order to obtain first selected points, a first operation for application of the inverse discrete Fourier transform to M points on the first selected points in order to obtain a first signal, and a first operation for third processing of the first signal in order to obtain a first output signal. The obtainment of a second output signal by carrying out the following second operations on the second channel: a second operation for first processing of the input signal in order to obtain a processed signal, a second operation for application of a discrete Fourier transform to M points on the processed signal to obtain M points of the spectrum of the processed signal, M being an integer strictly greater than 2, of the filtering method as previously described, the first signal being the processed signal, each point of the spectrum of the processed signal corresponding to the odd indices of a spectral analysis at 2*M points of the processed signal and being identified in a bijective manner by an index k, k being an odd number inclusively between 0 and 2*M−1, a second operation for second processing of the points of the spectrum of the processed signal in order to obtain second selected points, a second operation for application of the inverse discrete Fourier transform to M points on the second selected points in order to obtain a second signal, and a second operation for third processing of the second signal in order to obtain a second output signal. The method also includes the recombination of the first output signal and the second output signal in order to obtain the filtered signal.

the second operation for first processing comprises carrying out a frequency translation with a value equal to the ratio between the sampling frequency and the number 2*M, and the second operation for third processing comprises carrying out a frequency translation applied to the second signal with a value equal to the opposite of the ratio between the sampling frequency and the number 2*M.

the first operation for second processing comprises carrying out the shift of the points of the spectrum of the processed signal for M samples in order to obtain shifted points and calculating the sum of the points of the spectrum of the processed signal and the shifted points, and the second operation for second processing comprises carrying out the shift of the points of the spectrum of the processed signal for M samples in order to obtain shifted points and calculating the sum of the points of the spectrum of the processed signal and the shifted points.

the first operation for first processing comprises carrying out the shift of the input signal for M samples in order to obtain a shifted signal and calculating the sum of the input signal and the shifted signal, and the second operation for first processing comprises carrying out the shift of the input signal for M samples in order to obtain a shifted signal and calculating the difference between the input signal and the shifted signal.

the recombination step is carried out by calculating the difference between the first output signal and the second output signal.

the recombination step is carried out by calculating the difference between the first output signal and the second output signal, in order to obtain a first calculation signal, calculation of the sum for the first output signal and the second output signal, in order to obtain a second intermediate calculation signal, —shift of the second intermediate calculation signal by M samples in order to obtain a second calculation signal, and calculation of the sum of the first calculation signal and the second calculation signal in order to obtain the filtered signal.

A filter is also described, the filter being capable of carrying out the filtering method as previously described.

A filter is also described that is capable of filtering a numerical input signal sampled at a sampling frequency in order to obtain a filtered signal, the filter comprising an input terminal able to receive an input signal, a first processing channel able to obtain a first output signal by carrying out first operations, a second processing channel able to obtain a second output signal by carrying out second operations, a transmitter able to transmit the input signal on the first processing channel and the second processing channel, a mixer able to recombine the first output signal and the second output signal in order to obtain the filtered signal. The first processing channel is able to carry out the following first operations: first processing of the input signal in order to obtain a processed signal, application of a discrete Fourier transform to M points on the processed signal in order to obtain M points of the spectrum of the processed signal, M being an integer strictly greater than 2, each point of the spectrum of the processed signal corresponding to the even indices of a spectral analysis at 2*M points of the processed signal and being identified in a bijective manner by an index k, k being an even number inclusively between 0 and 2*M−1, the application being carried out by addition of the results of two processing channels, the first processing channel applying a discrete Fourier transform to M/2 points on the processed signal and the second calculating channel applying a shift of M/2 points to the processed signal, then applying a discrete Fourier transform to M/2 points on the first signal, second processing of the spectrum points of the processed signal in order to obtain first selected points, application of the inverse discrete Fourier transform to M points on the first selected points in order to obtain a first signal, and third processing of the first signal in order to obtain a first output signal. The second processing channel is able to carry out the following second operations: first processing of the input signal in order to obtain a processed signal, application of a discrete Fourier transform to M points on the processed signal in order to obtain M points of the spectrum of the processed signal, M being an integer strictly greater than 2, each point of the spectrum of the processed signal corresponding to the odd indices of a spectral analysis at 2*M points of the processed signal and being identified in a bijective manner by an index k, k being an odd number inclusively between 0 and 2*M−1, the application being carried out by addition of the results of two processing channels, the first processing channel applying a discrete Fourier transform to M/2 points on the processed signal and the second processing channel applying a shift of M/2 points to the processed signal, then applying a discrete Fourier transform to M/2 points on the first signal, second processing of the points of the spectrum of the processed signal in order to obtain second selected points, application of the inverse discrete Fourier transform to M points on the second selected points in order to obtain a second signal, and third processing of the second signal in order to obtain a second output signal.

According to specific embodiments, the filter comprises one or more of the following features, considered alone or according to any technically possible combinations:

the filter is able to filter a numerical input signal sampled at a sampling frequency in order to obtain a filtered signal, the filter comprising an input terminal able to receive an input signal, a first channel able to obtain a first output signal by carrying out first operations, a second channel able to obtain a second output signal by carrying out second operations, a transmitter able to transmit the input signal on the first channel and the second channel, a mixer able to recombine the first output signal and the second output signal in order to obtain the filtered signal, the first channel being able to carry out the following first operations: a first operation for first processing of the input signal in order to obtain a processed signal, a first operation for application of a discrete Fourier transform to M points on the processed signal to obtain M points of the spectrum of the processed signal, M being an integer strictly greater than 2, of the filtering method as previously described, the first signal being the processed signal, each point of the spectrum of the processed signal corresponding to the even indices of a spectral analysis at 2*M points of the processed signal and being identified in a bijective manner by an index k, k being an even number inclusively between 0 and 2*M−1, a first operation for second processing of the points of the spectrum of the processed signal in order to obtain first selected points, a first operation for application of the inverse discrete Fourier transform to M points on the first selected points in order to obtain a first signal, and a first operation for third processing of the first signal in order to obtain a first output signal. The second channel is able to carry out the following second operations: a second operation for first processing of the input signal in order to obtain a processed signal, a second operation for application of a discrete Fourier transform to M points on the processed signal to obtain M points of the spectrum of the processed signal, M being an integer strictly greater than 2, of the filtering method as previously described, the first signal being the processed signal, each point of the spectrum of the processed signal corresponding to the odd indices of a spectral analysis at 2*M points of the processed signal and being identified in a bijective manner by an index k, k being an odd number inclusively between 0 and 2*M−1, a second operation for second processing of the points of the spectrum of the processed signal in order to obtain second selected points, a second operation for application of the inverse discrete Fourier transform to M points on the second selected points in order to obtain a second signal, and a second operation for third processing of the second signal in order to obtain a second output signal.

Also proposed is a method for simplifying a sampled signal digital filter, the method including at least one step for providing a filter comprising first channels able to obtain a first output signal by carrying out first operations, and second channels able to obtain a second output signal by carrying out second operations, and a unit for recombination of the signals obtained at the output of the first channels and the second channels, the first operations and the second operations including at least one series of discrete nonstationary operations and stationary operations, the series pertaining to operations shared by the first and second operations, and a step for, in order to obtain a first intermediate filter, gathering channels including discrete nonstationary operations relating to the same signal, the first channels including the nonstationary operations relating to a first signal and the second channels including the nonstationary operations relating to a second signal, a step for, in order to obtain a second intermediate filter, on each of the first channels and second channels, commutative stationary operations with the nonstationary operations, in order to eliminate the redundant nonstationary operations, and a step for building the filter corresponding to the last obtained intermediate filter.

According to specific embodiments, the simplification method includes one or more of the following features, considered alone or according to any technically possible combinations:
- the nonstationary operations include two mutually reciprocal operations.
- the two signals of the gathering step form a complete signal.
- the number of points of each signal is identical.
- the nonstationary operations are chosen from a group made up of discrete Fourier transforms, inverse discrete Fourier transforms and frequency translations.
- the stationary operations are discrete operations in a group made up of filtering done in a frequency multiplicative manner, an addition, a delay and a difference.
- the sampled signal digital filter to be simplified is a filter as previously described or implementing a filtering method as previously described.

The description also relates to a processing chain comprising at least one filter as previously described.

According to specific embodiments, the processing chain includes one or more of the following features, considered alone or according to any technically possible combinations:
- the processing chain is a programmable logic circuit.
- the processing chain is an application-specific integrated circuit.
- the processing chain is made in the form of a programmable logic circuit.
- the processing chain is made in the form of an application-specific integrated circuit.

Furthermore, a system is also described including a processing chain as previously described.

BRIEF DESCRIPTION OF THE DRAWINGS

Other features and advantages of the invention will appear upon reading the following description of embodiments of the invention, provided as an example only and in reference to the drawings, which are.

DETAILED DESCRIPTION OF THE PREFERRED EMBODIMENTS

Figure 1:
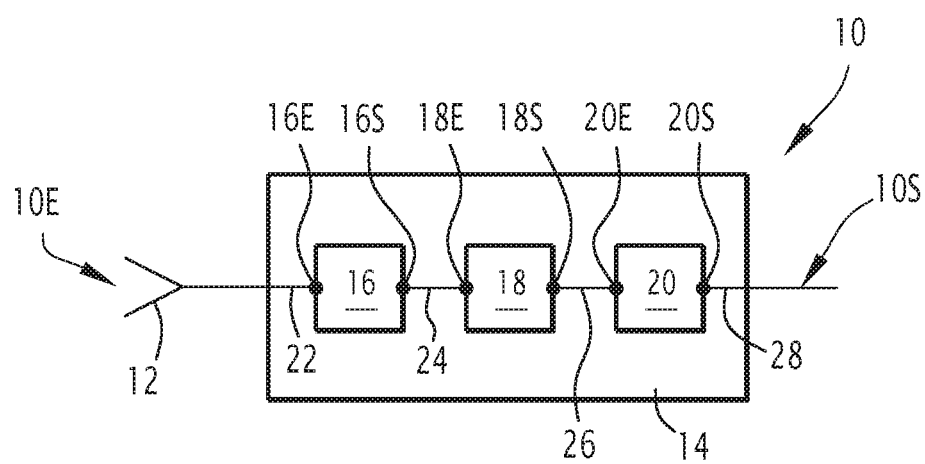
FIG. 1, a schematic view of an example radar comprising several filters.

A system 10 is schematically illustrated in FIG. 1.

The system 10 is for example a radar 10.

In a variant, the system 10 is a communication system, a countermeasures system or a detection system, such as a goniometer.

The radar 10 is able to receive an input signal 10E and to convert the input signal 10E into an output signal 10S that may be exploited for later uses.

The radar 10 includes an antenna 12 and a processing chain 14.

The antenna 12 is able to receive the input signal 10E.

The processing chain 14 is able to convert the input signal 10E into the output signal 10S.

The processing chain 14 is able to filter the input signal 10E.

According to the example of FIG. 1, the processing chain 14 includes three filters 16, 18 and 20 in series.

In fact, the first filter 16 includes an input terminal 16E connected to the antenna 12 by a first wire 22 and an output terminal 16S connected to the second terminal 18 by a second wire 24.

The second filter 18 includes an input terminal 18E connected to the output terminal 16S of the first filter 16 by the second wire 24 and an output terminal 18S connected to the third filter 20 by a third wire 26.

The third filter 20 includes an input 20E connected to the output terminal 18S of the second filter 18 by the third wire 26 and an output terminal 20S connected to the fourth wire 28 transmitting the output signal 10S.

According to another embodiment, the processing chain 14 includes a single filter.

In a variant, the processing chain 14 includes any number of filters, for example 2, 4 or 6.

The processing chain 14 is for example a programmable logic circuit. Such a circuit is often referred to using the acronym FPGA, for "field-programmable gate array", gate array that can be programmed in situ.

According to another example, the processing chain 14 is an application-specific integrated circuit. Such a circuit is often referred to using the acronym ASIC (application-specific integrated circuit).

Each filter 16, 18 and 20 is able to filter a numerical input signal that is sampled at a sampling frequency in order to obtain a filtered signal.

To simplify the description, it is assumed that each of the filters 16, 18 and 20 is identical.

In a variant, each filter of the processing chain 14 is different.

Figure 2:
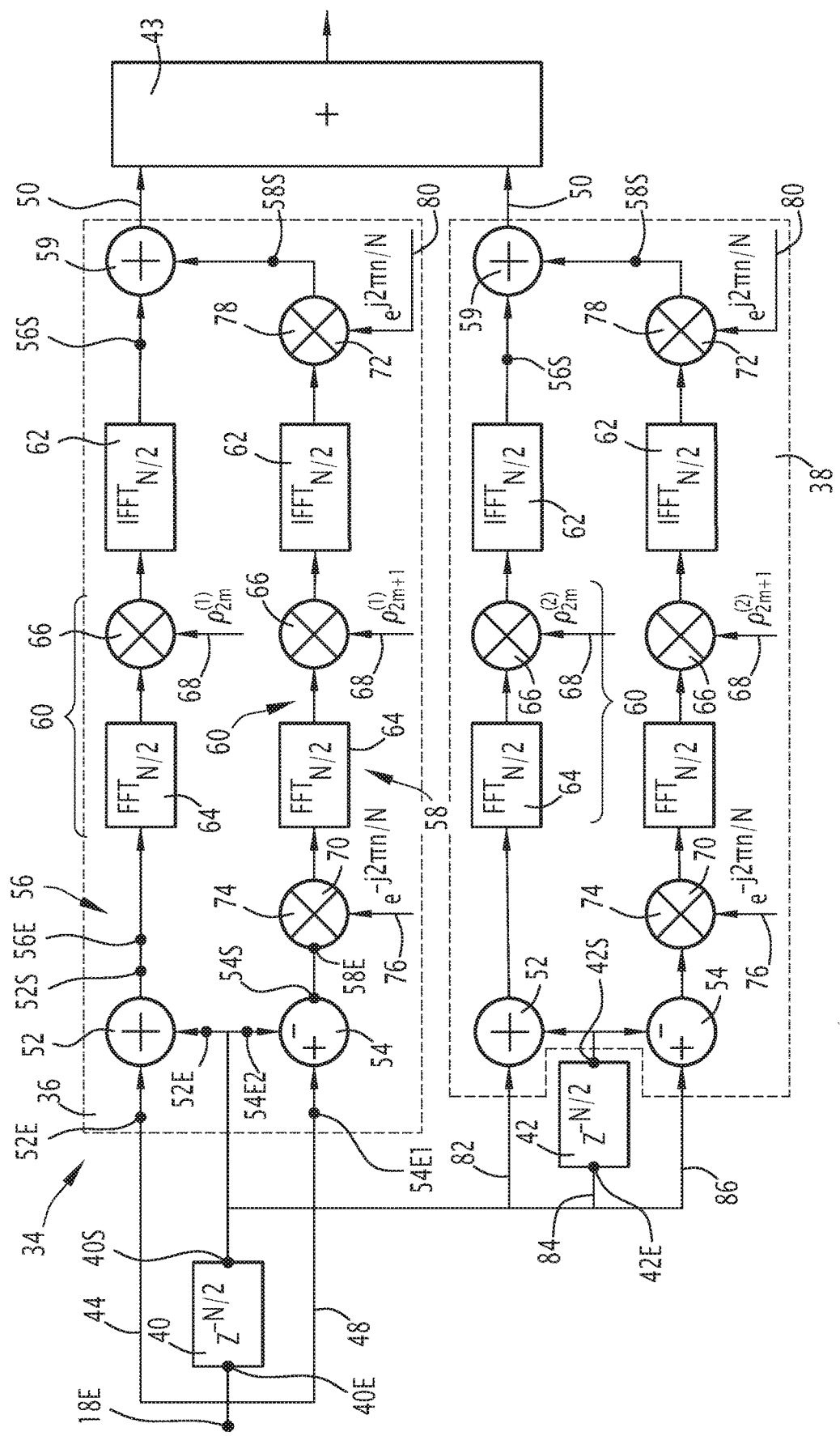
FIG. 2, a block diagram showing the operations performed by a first exemplary filter, FIG. 3, a block diagram showing the operations performed by a second exemplary filter, FIG. 4, a block diagram showing the operations performed by a third exemplary filter, FIG. 5, a block diagram showing the operations performed by a fourth exemplary filter, FIG. 6, a block diagram showing the operations performed by a fifth exemplary filter, FIG. 7, a block diagram showing the operations performed by a sixth exemplary filter, FIG. 8, a block diagram showing the operations performed by a seventh exemplary filter, FIG. 9, a block diagram illustrating the proper working of the filter of FIG. 8, FIG. 10, a block diagram illustrating a base circuit used to obtain the architecture of FIG. 2, FIG. 11, a block diagram showing the operations performed by an eighth exemplary filter, FIG. 12, a block diagram showing a circuit able to perform part of the operations of the eighth exemplary filter, FIG. 13, a block diagram showing the operations performed by a ninth exemplary filter, and FIG. 14, a block diagram showing a circuit able to perform part of the operations of the ninth exemplary filter.

An example of a second filter 18 is illustrated more specifically in FIG. 2.

The second filter 18 includes two main blocks 34, which are the first main block 36 and the second main block 38, a first calculating unit 40, a second calculating unit 42 and an output adder 43.

The first main block 36 and the second main block 38 are identical.

In this context, "identical" means that each of the two main blocks 36 and 38 is able to apply the same operations on an incident signal.

Therefore, for simplification reasons, only the first main block 36 is described hereinafter.

The first main block 36 includes three input branches 44, 46 and 48 and one output branch 50.

The first main block 36 also includes an input adder 52, an input subtracter 54, a first processing channel 56, a second processing channel 58 and an output adder 59.

The first branch 44 of the first main block 36 is directly connected to the input 18E of the filter 18.

The second branch 46 of the first main block 36 is connected to the first calculating unit 40.

More specifically, the first calculating unit 40 includes an input 40E and an output 40S and the output 40S of the first calculating unit 40 is connected to the second branch 46 of the first main block 36.

The input 40E of the first calculating unit 40 is directly connected to the input 18E of the filter 18.

The first calculating unit 40 is a shifting unit.

The shift is illustrated schematically in FIG. 2 by a box 40 in which "$z^{-N/2}$" is inscribed in reference to a shifting technique by using the Z-transform.

Hereinafter, N is an even integer strictly greater than 4 such that the integer N/2 is greater than or equal to 2.

The integer N corresponding to the number of samples, it is generally relatively large, in particular greater than or equal to 100.

The third branch 48 of the first main block 36 is directly connected to the input 18E of the filter 18.

The input adder 52 and the input subtracter 54 interacting with the two processing channels 56 and 58, it should now be introduced that the first processing channel 56 extends between an input 56E and an output 56S and that the second processing channel 58 extends between an input 58E and an output 58S.

The input adder 52 includes two inputs 52E respectively connected to the first branch 44 of the first main block 36 and to the second branch 46 of the first main block 36. The input adder 52 also includes an output 52S connected to the input 56E of the first processing channel 56.

The input adder 52 is able to carry out an addition operation applied to the two output signals of the first branch 44 and of the second branch 46 of the first main block 36, the signal obtained after addition being injected at the input 56E of the first processing channel 56.

From a more mathematical perspective, the input adder 52 is able to perform the addition between a signal and the same signal shifted by N/2 points.

The input subtracter 54 includes a first input 54E1 connected to the third branch 48 of the first main block 36 and a second input 54E2 connected to the second branch 46 of the first main block 36. The input subtracter 54 also includes an output 54S connected to the input 58S of the second processing channel 58.

The input subtracter 54 is able to carry out a difference operation applied between the two input signals of the third branch 48 and of the second branch 46 of the first main block 36, the signal obtained after subtraction being injected at the input 58S of the second processing channel 58.

From a more mathematical perspective, the input subtracter 54 is able to perform the subtraction between a signal and the same signal shifted by N/2 points.

The first processing channel 56 successively includes two subunits: a first subunit 60 and a second subunit 62.

In other words, the two subunits 60 and 62 are in series.

The first subunit 60 is able to apply a discrete Fourier transform to N/2 points on the signal previously obtained (signal before the first subunit 60), called processed signal, in order to obtain N/2 points of the spectrum of the processed signal, each point of the spectrum of the processed signal corresponding to the even indices of the spectral analysis with 2*N/2=N points of the processed signal and being identified in a bijective manner by an index k, k being an even number inclusively between 0 and 2*M−1 (with M=N/2). In this case, the points are numbered from 0 to 2*M−1.

This amounts to calculating the even coefficients of the spectral analysis with N points of the processed signal in order to obtain selected points.

For example, the calculated discrete Fourier transform is a fast Fourier transform denoted $FFT_{N/2}$.

This is illustrated schematically in FIG. 2 by a box 64 in which $FFT_{N/2}$ is inscribed, and by a multiplier 66 at which an incoming arrow 68 arrives with the inscription "$\rho^{(1)}_{2m}$", the (1) referring to the fact that this is the first processing channel 56.

The second subunit 62 is also able to carry out an operation to apply the inverse discrete Fourier transform to N/2 points on the selected points.

For example, the calculated discrete Fourier transform is a fast Fourier transform denoted $IFFT_{N/2}$.

This is illustrated schematically in FIG. 2 by a box in which $IFFT_{N/2}$ is inscribed.

The second subunit 62 has an output connected to the output adder 59.

The second processing channel 58 also includes a first subunit 60 and a second subunit 62 as well as two shifting modules 70 and 72.

As previously indicated, the two subunits 60 and 62 of the second processing channel 58 are similar to the two subunits 60 and 62 of the first processing channel 56.

The first shifting module 70 is located between the input 58S of the second processing channel 58 and the first subunit 60.

The first shifting module 70 is able to carry out a frequency translation by a value equal to the ratio between the sampling frequency and the number N.

Such a first shifting module 70 is symbolized by an arrow 74 on a multiplier 76, the arrow 74 bearing inscription "$e^{-2j\pi n/N}$" in reference to a usual translation technique that consists of multiplying the signal by a carefully chosen complex exponential function.

The second shifting module 72 is located between the second subunit 60 and the output 58S of the second processing channel 58.

In the case at hand, the second shifting module 72 is able to carry out a frequency translation by a value opposite the ratio between the sampling frequency and the number N.

Such a second shifting module 72 is symbolized by an arrow 78 on a multiplier 80, the arrow 78 bearing inscription "$e^{2j\pi n/N}$" in reference to a usual translation technique that consists of multiplying the signal by a carefully chosen complex exponential function.

The output adder 59 is respectively connected to the two outputs 56S and 58S of each processing channel 56 and 58 and delivers, as output, the sum of the two outputs 56S and 58S of each processing channel 56 and 58.

The output 59S of the output adder 59 corresponds to the output branch 50 of the first main block 36.

As previously indicated, the second main block 38 includes the same elements as the first main block 36. Only the signals injected at the input differ.

The first input branch 82 of the second main block 38 is connected to the second input branch 46 of the first main block 36.

This means that the input signal of the filter 18 shifted by N/2 is injected in the first input branch 82 of the second main block 38.

The second input branch 84 of the second main block 38 is connected to a second calculating unit 42.

More specifically, the second calculating unit 42 includes an input 42E and an output 42S and the output 42S of the second calculating unit 42 is connected to the second input branch 84 of the second main block 38.

The input 42E of the second calculating unit 42 is directly connected to the input 18E of the filter 18.

The second calculating unit 42 is a shifting unit.

The shift is illustrated schematically in FIG. 2 by a box 42 in which "$z^{-N/2}$" is inscribed in reference to a shifting technique by using the Z-transform.

This means that the input signal of the filter 18 shifted by N is injected in the second input branch 84 of the second main block 42.

The third input branch 86 of the second main block 38 is connected directly to the second input branch 46 of the first main block 36.

This means that the input signal of the filter 18 shifted by N/2 is injected in the third input branch 86 of the second main block 38.

Lastly, the output adder 43 is connected to the output branch of each main block 36 and 38.

The output 18S of the filter 18, which is connected to the output of the output adder 59, is passed through by a signal corresponding to the sum of the signals circulating in the output branches of each main block 36 and 38.

Figure 3:
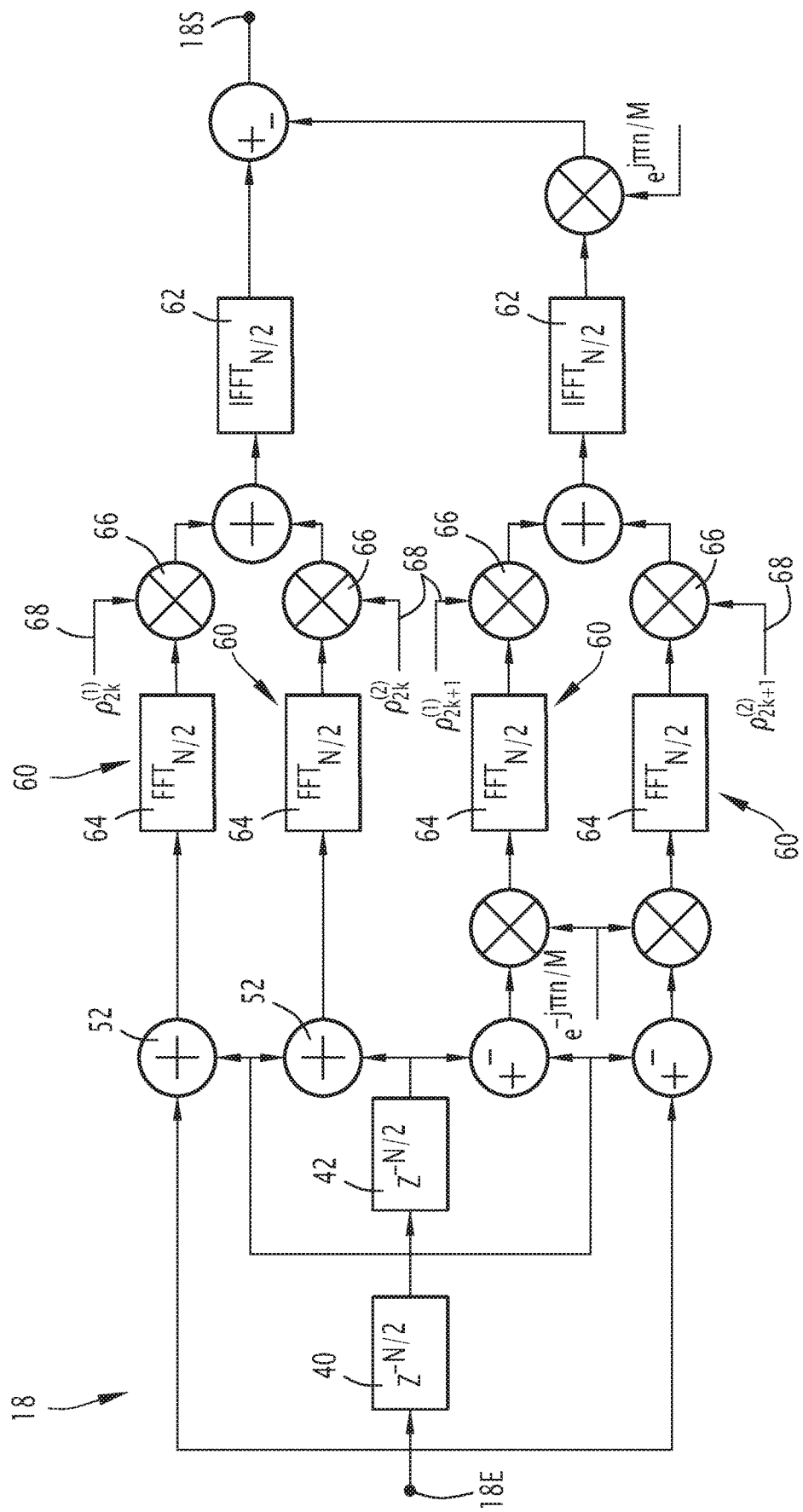

An improved architecture for the filter 18 of FIG. 2 is proposed in FIG. 3.

The optimized architecture in FIG. 3 advantageously uses the similarity between, on the one hand, the first processing channels 56 of the main blocks, and on the other hand, the second processing channels 58 of the main blocks. In such a context, similarity refers to similar operations or processing.

More specifically, in the case at hand, use is made of the fact that in the first processing channels 34, the IFFT operations pertain to the spectrum points corresponding to the even indices whereas, in the second processing channels 34, the IFFT operations pertain to the points of the spectrum corresponding to the odd indices.

According to the architecture of FIG. 3, the first processing channels 34 are pooled by an intermediate adder, which makes it possible to use a single unit for applying the IFFT at the output instead of both in the case of FIG. 2.

Similarly, the second processing channels 34 are pooled by an intermediate adder, which makes it possible to use a single unit for applying the IFFT at the output for each second processing channel 34 as well as a single shift application unit instead of both at the output in the case of FIG. 2.

The final adder is replaced by a subtracter.

The filter 18 of FIG. 3 is thus optimized relative to the filter 18 of FIG. 2, since the filter 18 of FIG. 3 involves three resource-heavy operations, namely two IFFT operations and one shifting operation.

Figure 4:
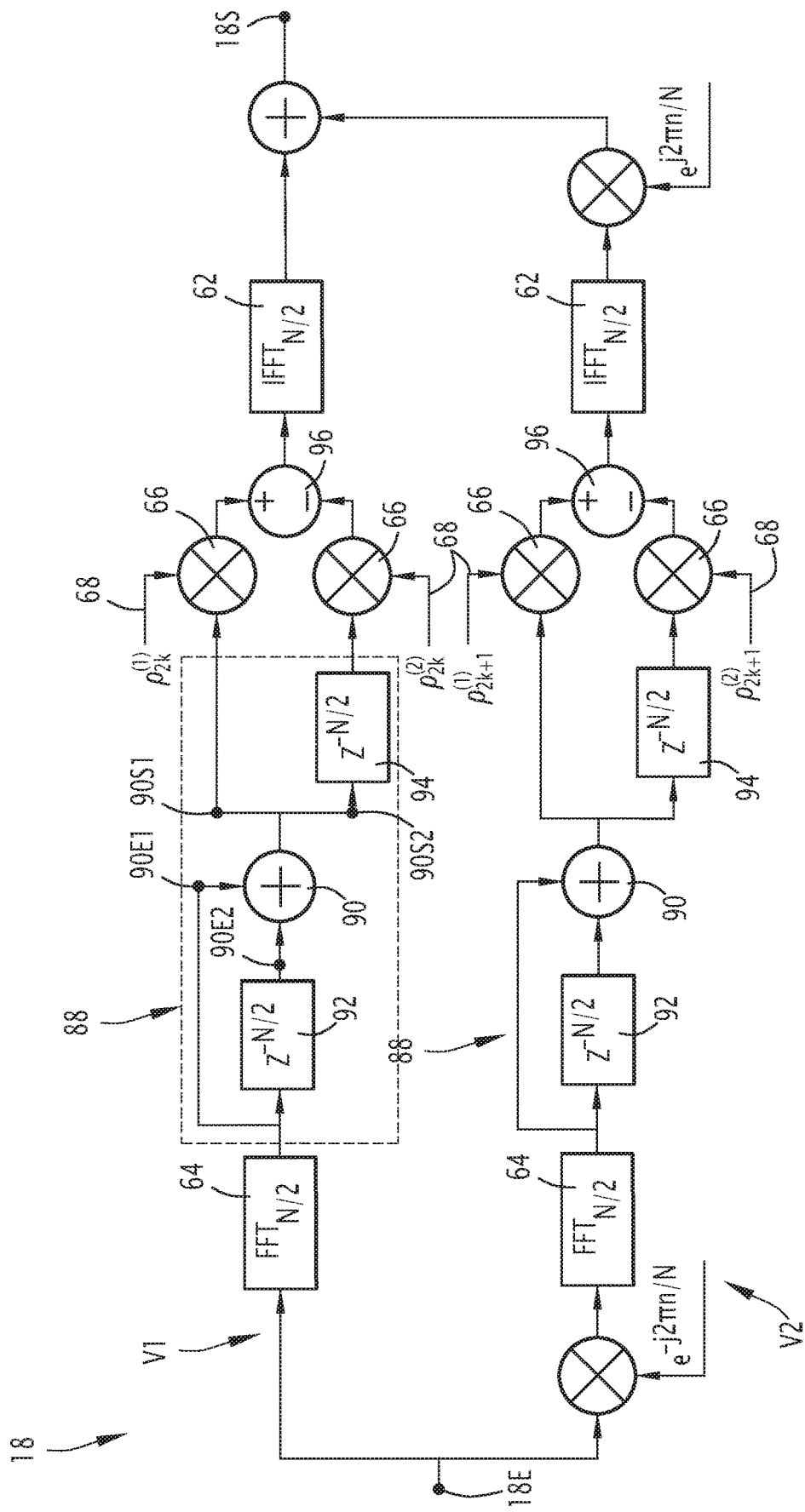

A still further improved architecture for the filter 18 of FIG. 2 and the filter 18 of FIG. 3 is proposed in FIG. 4.

Like for the case of FIG. 3, the optimized architecture in FIG. 4 advantageously uses the similarity between, on the one hand, the first processing channels 56 of the main blocks, and on the other hand, the second processing channels 58 of the main blocks.

More specifically, in the case at hand compared with the case of FIG. 3, use is made of the fact that the FFT operation of a first processing channel 56 differs only from the FFT operation of the other first processing channel 56 by the application of shifts on the points on which the considered FFT operation is applied. Similarly, the FFT operation of a second processing channel 58 differs only from the FFT operation of the other second processing channel 58 by the application of shifts on the points on which the considered FFT operation is applied.

Since the shifts can be pooled and applied after the FFT operation, the architecture of FIG. 4 is obtained.

The filter of FIG. 4 thus includes two processing channels V1 and V2 that are summed at the output by a final adder.

The second channel V2 includes the same series of operations as the operations of the first channel V1. The second channel V2 differs from the first channel V1 only by the presence of a shifting unit upstream of the series of operations and the presence of a shifting unit in the reverse direction downstream of the series of operations. The operations applied between the two shifting units that are the same as the operations of the first channel V1 are now described through the description of the first channel V1 that follows.

The first channel V1 successively includes a $FFT_{N/2}$ unit 64, a unit for preparation of the signal 88, two selection units 66, an adder 96 and an $IFFT_{N/2}$ unit 62.

The $FFT_{N/2}$ unit 64 is able to apply a FFT to N/2 points on the signal coming from the input terminal 18E of the filter 18.

The signal preparation unit 88 serves to prepare the signal to be sent for each selection unit.

The signal preparation unit 88 includes only addition subunits 90 and shifting subunits 92 and 94.

More specifically, the signal preparation unit 88 includes one addition subunit and two shifting subunits.

The addition subunit 90 is able to perform the addition between two input branches, a first input branch corresponding to the spectrum obtained at the output of the $FFT_{N/2}$ unit and a second input branch including a shifting subunit of N/2 represented by a box $z^{-N/2}$. The second input branch thus corresponds to the spectrum obtained at the output of the $FFT_{N/2}$ unit with a shift of N/2 points.

The addition subunit 90 includes two output branches, a first output branch connected directly to the first selection unit and a second output branch including a shifting subunit of N/2 represented by a box $z^{-N/2}$, the shifting subunit of the second output branch being connected to the second selection unit.

The selection units 66 are next connected to the adder 96, the output of which is connected to the IFFT$_{N/2}$ unit.

The filter architecture 18 shown in FIG. 4 is thus optimized relative to the filter 18 of FIG. 3 by the fact that two very resource-heavy FFT operations are no longer carried out.

Figure 5:
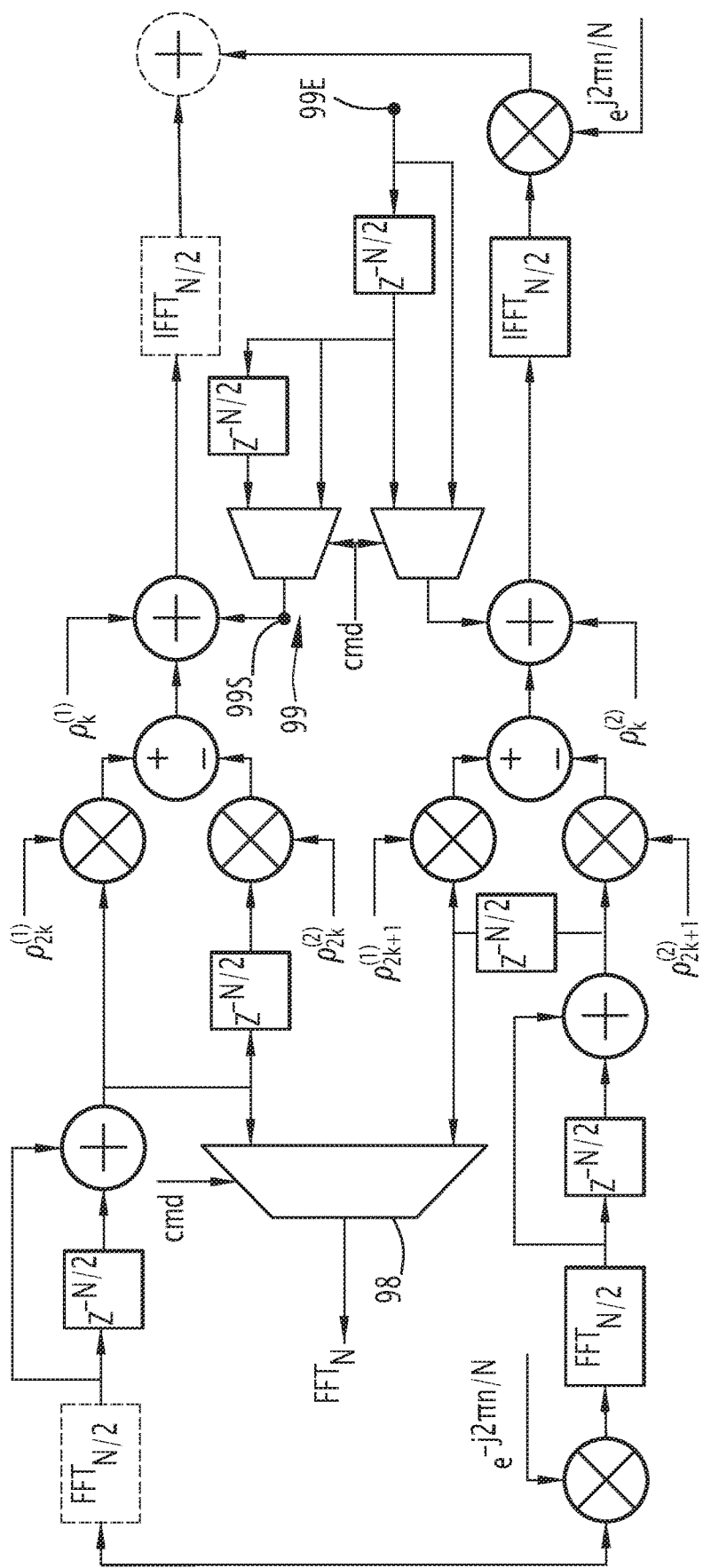

As shown by FIG. 5, it is also possible to use the filter architecture 18 of FIG. 4 to introduce calculation extractors to recover the result of these operations, provided that these results can be used for another calculation of the filter 18 or another element outside the filter 18.

According to the example of FIG. 5, the filter 18 includes the same elements as the filter 18 of FIG. 4 as well as two calculation extractors 98 and 99.

The first calculation extractor 98 is used to export the result of the N-point FFT to the outside of the filter 18.

The second calculation extractor 99 serves to partially implement the N/2 point IFFT on a signal injected from the outside in the adder located directly upstream of the IFFT application unit.

In a corresponding manner, as shown with dotted lines, the calculation of the FFT$_{N/2}$ can be done in another filter such that the presence of the calculating unit of the FFT$_{N/2}$ is avoided.

The filter architecture 18 proposed for FIG. 5 thus makes it possible to pool the calculating resources between several calculation stages or devices.

Such simplification principles more generally correspond to a simplification method for a sampled signal digital filter using the aforementioned commutative properties for stationary (shifting, adding) and discrete nonstationary (FFT and IFFT) operations.

Such a simplification method includes at least a supply step S1, a gathering step S2, a commutating step S3 and a construction step S4.

During the supply step S1, a filter is supplied comprising first channels able to obtain a first output signal by carrying out first operations, second channels able to obtain a second output signal by carrying out second operations, and a recombination unit for the signals obtained at the output of the first channels and the second channels.

The first operations and the second operations including at least the same series of discrete nonstationary operations and stationary operations, the series pertaining to operations common to the first and second operations.

During the gathering step S2, in order to obtain an intermediate filter, channels are gathered including discrete nonstationary operations pertaining to the same signal, the first gathered channels including the nonstationary operations pertaining to a first signal and the second gathered channels including the nonstationary operations pertaining to a second signal.

During the commutating step S3, in order to obtain a second intermediate filter, on each of the first channels and second channels, stationary operations are switched with the nonstationary operations, in order to eliminate the redundant nonstationary operations.

During the construction step S4, the filter is constructed corresponding to the last obtained intermediate filter.

Such a simplification method makes it possible to obtain computing circuits involving fewer computing resources.

In other words, the method achieves a simplification in that resources are saved.

According to one specific example, at least one of the nonstationary and stationary operations is a discrete operation.

Preferably, the nonstationary operations include two mutually reciprocal operations.

According to one particular embodiment, the two signals of the gathering step form a complete signal.

Advantageously, the number of points of each signal is identical.

According to one embodiment, the nonstationary operations are chosen from a group made up of discrete Fourier transforms, inverse discrete Fourier transforms and frequency translations.

In one particular example, the stationary operations are discrete operations in a group made up of filtering done in a frequency multiplicative manner, an addition, a delay and a difference.

As previously explained, the simplification method makes it possible to obtain a plurality of filters 18 performing the same function with more or fewer resources involved.

Figure 6:
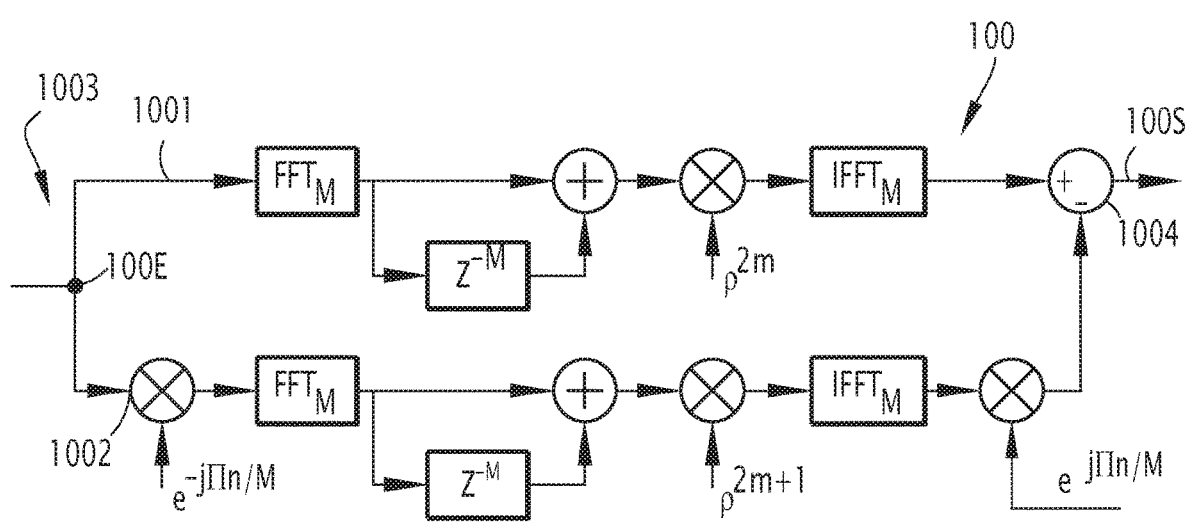
Figure 7:
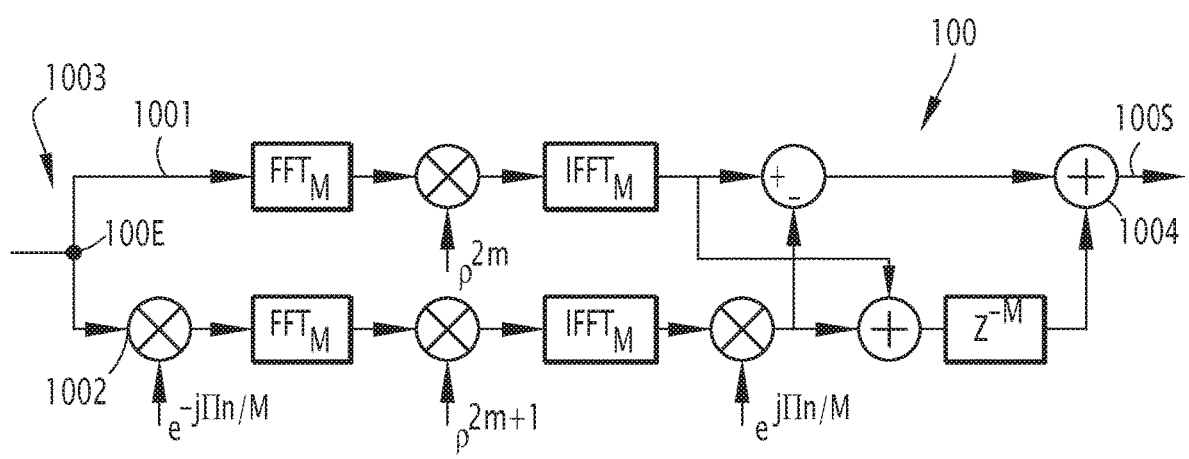
Figure 8:
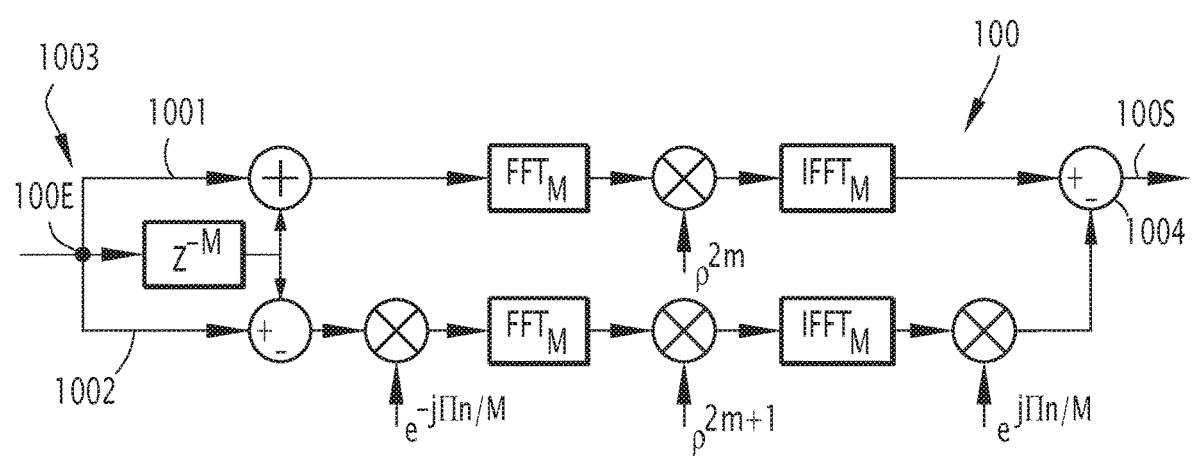
Figure 9:
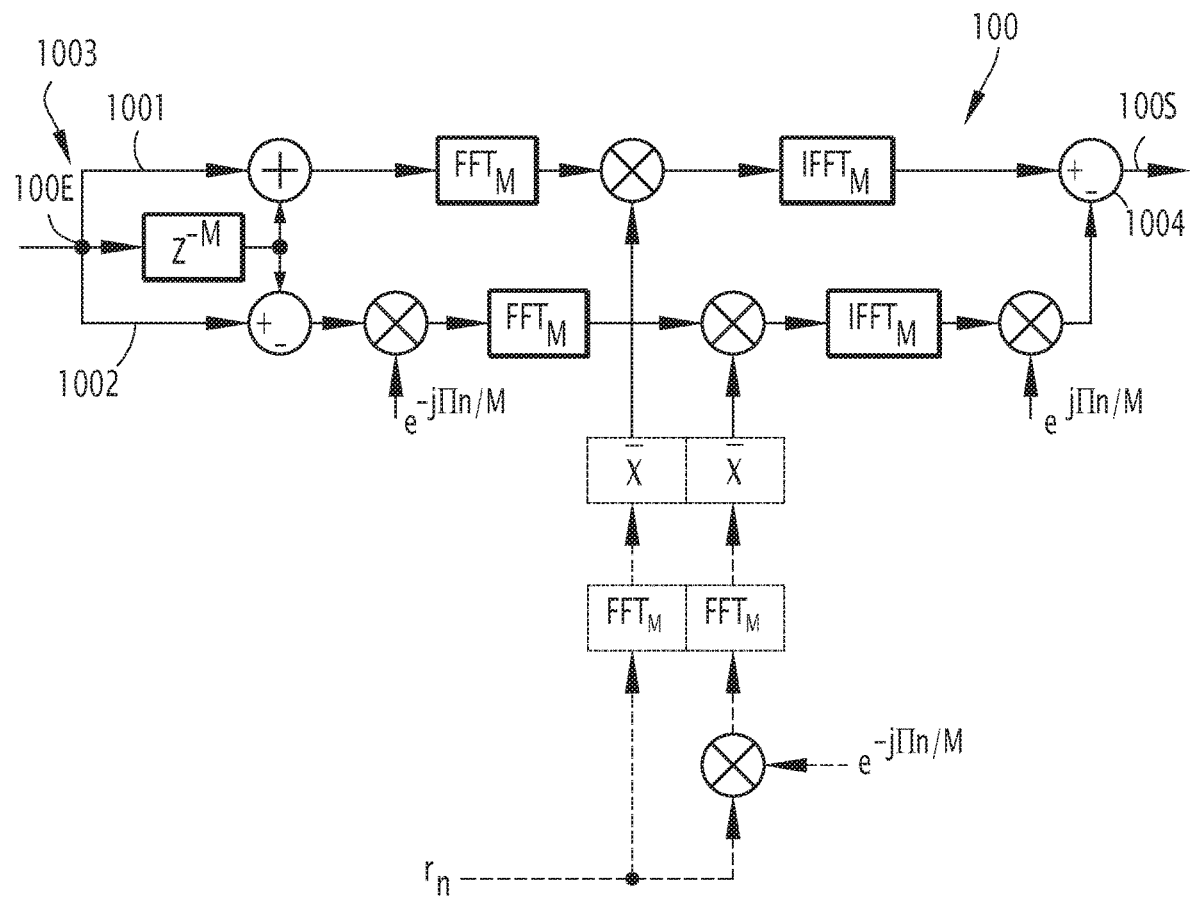

Each aforementioned implementation of the filter 18 should be compared to the filters 100 of FIGS. 6 to 8 as well as in reference to FIG. 9, which corresponds to a block diagram illustrating the proper working of the filter 100 of FIG. 8.

In order to facilitate the comparison between the different filters, the reference signs of the elements relative to the filter of FIGS. 1 to 5 (and later FIGS. 11 to 14) are based on reference sign 18, whereas the reference signs of the elements relative to the filter of FIGS. 6 to 8 are based on FIG. 2. Thus, the term "filter 18" is used in the remainder of the description to designate a filter as described in one of FIGS. 1 to 5 and 11 to 14, while the term "filter 100" is used to designate a filter as described in one of FIGS. 6 to 8.

Nevertheless, it will be understood that remarks that apply to the filter 18 are also valid for the filter 100 and such remarks are not repeated hereinafter.

As an example, the filter 18 includes an input 18E and an output 18S. In a corresponding manner, the filter 100 includes an input 100E and an output 100S.

Reciprocally, remarks that apply to the filter 100 are also valid for the filter 18 when this is technically possible.

As illustrated by FIG. 6, the filter 100 comprises a first channel 1001, a second channel 1002, a transmitter 1003 and a mixer 1004.

The input terminal 100E is able to receive an input signal.

The first channel 1001 is able to obtain a first output signal by carrying out first operations.

The first channel 1001 is able to carry out a first operation for first processing of the input signal in order to obtain a processed signal.

According to the example of FIG. 6, the first processing is the sending of the input signal.

The first channel 1001 is also able to apply a discrete Fourier transform to M points on the processed signal in order to obtain M points of the spectrum of the processed signal, M being an integer strictly greater than 2, each point of the spectrum of the processed signal corresponding to the even indices of a spectral analysis with 2*M points of the processed signal and being identified in a bijective manner by an index k, k being an even number inclusively between 0 and 2*M−1. In this case, the points are numbered from 0 to 2*M−1.

This amounts to calculating the even coefficients of the spectral analysis with 2*M points of the processed signal.

For example, the calculated discrete Fourier transform is a fast Fourier transform denoted FFT$_M$.

This is illustrated schematically in FIG. 2 by a box in which $FFT_M$ is inscribed and by a multiplier on which an incoming arrow arrives with the inscription "ρ2m".

The first channel 1001 is also able to carry out a first operation for second processing of the points of the spectrum of the processed signal in order to obtain first selected points.

The first channel 1001 is able to carry out the shifting of the second points of the spectrum of the processed signal for M samples in order to obtain shifted points and calculating the sum of the points of the spectrum of the processed signal and the shifted points.

The shift is illustrated schematically in FIG. 6 by a box in which "$z^{-M}$" is inscribed in reference to a shifting technique by using the Z-transform.

A sum sign where two incoming arrows arrive, one corresponding to a path passing through the box in which "$z^{-M}$" is inscribed and the other corresponding to a path not passing therethrough, schematically shows the first operation for second processing.

The first path 1001 is also able to carry out a first operation to apply the inverse discrete Fourier transform to M points on the first selected points in order to obtain a first signal.

For example, the calculated discrete Fourier transform is a fast Fourier transform denoted $IFFT_M$.

This is illustrated schematically in FIG. 6 by a box in which $IFFT_M$ is inscribed.

The first channel 1001 is also able to carry out a first operation for third processing of the first signal in order to obtain a first output signal.

In the case at hand, the first operation for the third processing consists of transmitting the first output signal to the mixer 1004.

The second channel 1002 is able to obtain a second output signal by carrying out second operations.

The second channel 1002 is able to carry out a second operation for first processing of the input signal in order to obtain a processed signal.

In the case at hand, the second channel 1002 is able to carry out a frequency translation by a value equal to the ratio between the sampling frequency and the number 2*M.

Such an operation is symbolized by an arrow on a multiplier, the arrow bearing inscription "$e^{-j\pi n/M}$" in reference to a usual translation technique that consists of multiplying the signal by a carefully chosen complex exponential function.

The second channel 1002 is also able to carry out a second operation to apply a discrete Fourier transform to M points on the processed signal in order to obtain M points of the spectrum of the processed signal, each point of the spectrum of the processed signal corresponding to the odd indices of a spectral analysis with 2*M points of the processed signal and being identified in a bijective manner by an index k, k being an odd number inclusively between 0 and 2*M−1.

The second channel 1002 is able to carry out a second operation for second processing of the points of the spectrum of the processed signal in order to obtain selected second points.

The second channel 1002 is thus able to carry out the shifting of the second points of the spectrum of the processed signal for M samples in order to obtain shifted points and calculating the sum of the points of the spectrum of the processed signal and the shifted points. From the perspective of the signal, the shift is a time delay.

The shift is illustrated schematically in FIG. 6 by a box in which "$z^{-M}$" is inscribed in reference to a shifting technique by using the Z-transform.

A sum sign where two incoming arrows arrive, one corresponding to a path passing through the box in which "$z^{-M}$" is inscribed and the other corresponding to a path not passing therethrough, schematically shows the second operation for second processing.

The second channel 1002 is also able to carry out a second operation to apply the inverse discrete Fourier transform to M points on the second selected points in order to obtain a second signal.

The second channel 1002 is also able to carry out a second operation for third processing of the second signal in order to obtain a second output signal.

In the case at hand, the second channel 1002 is able to carry out a frequency translation by a value opposite the ratio between the sampling frequency and the number 2*M.

Such an operation is symbolized by an arrow on a multiplier, the arrow bearing inscription "$e^{j\pi n/M}$" in reference to a usual translation technique that consists of multiplying the signal by a carefully chosen complex exponential function.

The transmitter 1003 is able to transmit the input signal over the first channel 1001 and the second channel 1002.

The mixer 1004 is able to recombine the first output signal and the second output signal in order to obtain the filtered signal.

In the case at hand, since the recombination is obtained by a difference of the first output signal and the second output signal, the mixer 1004 is shown by a circle with a + sign and a − sign.

The operation of the second filter 100 is now described in reference to one example embodiment of a method for filtering a numerical input signal sampled at a sampling frequency in order to obtain a filtered signal.

The method includes a supply step, a transmission step, a step for obtaining a first output signal, a step for obtaining a second output signal and a recombination step.

In the supply step, the input signal is supplied on the input terminal 100E of the second filter 100.

In the transmission step, the input signal is transmitted by the transmitter 1003 on the two channels 1001 and 1002.

In the step for obtaining the first output signal, the fast Fourier transform to M points of the input signal is calculated in order to obtain the even coefficients of a spectral analysis at 2*M points of the input signal.

A first operation is next performed to carry out the shift of the second spectrum points of the processed signal for M samples in order to obtain shifted points and calculating the sum of the points of the spectrum of the processed signal and the shifted points. First selected points are thus obtained.

Application is next done of an inverse discrete Fourier transform to M points on the first selected points in order to obtain a first output signal.

The first output signal is sent to the transmitter 1003.

In the step for obtaining the second output signal, a frequency translation is carried out by a value equal to the ratio between the sampling frequency and the number 2*M. A processed signal is thus obtained.

The fast Fourier transform to M points of the processed signal is calculated in order to obtain the odd coefficients of a spectral analysis at 2*M points of the input signal.

A second operation is next performed to carry out the shift of the second spectrum points of the processed signal for M samples in order to obtain shifted points and the calculation of the sum of the points of the spectrum of the processed signal and the shifted points. Second selected points are thus obtained.

An inverse discrete Fourier transform is next applied to M points on the second selected points in order to obtain a second signal.

An implementation of a frequency translation applied to the second signal is next carried out with a value equal to the opposite of the ratio between the sampling frequency and the number 2*M. This makes it possible to obtain an output signal.

The recombination step is next carried out using the mixer 1004 in order to obtain the filtered signal by calculating the difference between the first output signal and the second output signal.

The method makes it possible to obtain a filtered signal more easily.

In fact, the method, relative to a method of the state of the art, makes it possible to limit the required memory space by 40%, as demonstrated in the discussion on FIG. 9.

Furthermore, it is also possible to pool the calculations, since the two channels 1001 and 1002 are synchronous.

In a variant, the second filter 100 is according to the embodiment of FIG. 7.

Elements identical to the embodiment of FIG. 6 are not described again. Only the differences are shown.

The second filter 100 according to the embodiment of FIG. 7 differs from the second filter 100 according to the embodiment of FIG. 6 by the operations that the first channel 1001 and the second channel 1002 are able to carry out and by the nature of the operations performed during the recombination step.

In the case of FIG. 6, each of the first operations for first processing and second processing consists of transmitting the considered signal.

In the case of FIG. 7, the second operation for first processing comprises carrying out a frequency translation by a value equal to the ratio between the sampling frequency and the number 2*M.

The second processing consists of transmitting the considered signal.

The second operation for third processing comprises carrying out a frequency translation applied to the second signal with a value equal to the opposite of the ratio between the sampling frequency and the number 2*M.

In the recombination step, the difference between the first output signal and the second output signal is calculated in order to obtain a first calculation signal.

The sum of the first output signal and the second output signal is next calculated, in order to obtain a second intermediate calculation signal.

A shift of the second intermediate calculation signal by M samples is also carried out in order to obtain a second calculation signal.

The sum of the first calculation signal and the second calculation signal is also calculated, in order to obtain the filtered signal.

The same advantages relate to the embodiment according to FIG. 7.

According to another variant, the second filter 100 is according to the embodiment of FIG. 6.

Elements identical to the embodiment of FIG. 6 are not described again. Only the differences are shown.

The second filter 100 according to the embodiment of FIG. 8 differs from the second filter 100 according to the embodiment of FIG. 6 by the operations that the first channel 1001 and the second channel 1002 are able to carry out.

In the case of FIG. 8, the first operation for first processing carries out the shift of the input signal for M samples in order to obtain a shifted signal and the calculation of the sum of the input signal and the shifted signal.

Each first operation for second processing and third processing consists of transmitting the signal.

According to the example of FIG. 8, the second operation for first processing carries out the shift of the input signal for M samples in order to obtain a shifted signal and the calculation of the sum of the input signal and the shifted signal. The second operation for first processing next carries out a frequency translation by a value equal to the ratio between the sampling frequency and the number 2*M.

The second operation for second processing consists of transmitting the signal.

The second operation for third processing carries out a frequency translation applied to the second signal with a value equal to the opposite of the ratio between the sampling frequency and the number 2*M.

The same advantages relate to the embodiment according to FIG. 8.

In the following section, in reference to FIG. 9, it is shown that the proposed calculations make it possible to obtain the desired filtering.

To calculate a section of M output points, a section of 2M points $a_n$ is used for indices n which, by convention, will be such that $0 \leq n \leq 2*M-1$.

To understand the remainder of the calculation, general information should be explained on the decomposition of a discrete Fourier transform (DFT) into Radix (x being the number of factorizable points).

The N-point discrete Fourier transform of a sequence of N points $x_n$ (N being an integer) is equal to:

$$X_m = \sum_{n=0}^{N-1} x_n e^{-j2\pi \frac{n \times m}{N}}$$

In the case where N is the product $N = N_1 \times N_2$ of two integers $N_1$ and $N_2$, it can be written:

$$X_{m_1 N_2 + m_2} = \sum_{n_1=0}^{N_1-1} \sum_{n_2=0}^{N_2-1} x_{n_2 N_1 + n_1} e^{-j2\pi \frac{(n_2 N_1 + n_1) \times (m_1 N_2 + m_2)}{N_1 N_2}} =$$

$$\sum_{n_1=0}^{N_1-1} \sum_{n_2=0}^{N_2-1} x_{n_2 N_1 + n_1} e^{-j2\pi \frac{n_1 \times m_2}{N_1 N_2}} e^{-j2\pi \frac{n_1 \times m_1}{N_1}} e^{-j2\pi \frac{n_2 \times m_2}{N_2}}$$

The discrete Fourier transform corresponds to the cascade of a $N_2$ point discrete Fourier transform and a $N_1$ point discrete Fourier transform.

In a natural embodiment of the FFT, the $N_2$ point discrete Fourier transform ("multiplexed") is followed by the $N_1$ point Fourier transform ("fast"), which corresponds to:

$$\underset{\substack{0 \leq m_1 \leq N_1-1 \\ 0 \leq m_2 \leq N_2-1}}{X_{m_1 N_2 + m_2}} = \sum_{n_2=0}^{N_2-1} \sum_{n_1=0}^{N_1-1} x_{n_2 N_1 + n_1} \times e^{-j2\pi \frac{(n_2 N_1 + n_1) \times (m_1 N_2 + m_2)}{N_1 N_2}} =$$

$$\sum_{n_1=0}^{N_1-1} e^{-j2\pi \frac{n_1 m_1}{N_1}} \times \underbrace{e^{j2\pi \frac{n_1 m_2}{N_1 N_2}}}_{\text{twiddle factors}} \times \underbrace{\sum_{n_2=0}^{N_2-1} x_{n_2 N_1 + n_1} e^{-j2\pi \frac{n_2 m_2}{N_2}}}_{N_2 \text{ point FFT multiplexed by } N_1 \text{ (radix } N_2)}$$

$N_1$ point FFT (radix $N_1$)

By definition, the fast index of the time $n_1$ arrives in the short time. The slow index of the frequencies $m_1$ comes out in the short time and the fast index of the frequencies $m_2$ comes out in the long time ("bit reverse").

The second of the discrete Fourier transforms involved is weighted by a local oscillator allowing a fine shift of the spectrum; the exponential term allowing this translation is called "twiddle factor":

$$\text{twiddle factor} = e^{-j2\pi \frac{n_1 \times m_2}{N_1 N_2}}$$

In principle, the fastest varying output index is $m_1$. Since it corresponds to the "fast" discrete Fourier transform, that is to say not multiplexed. Thus, the output order of the frequencies is not the natural order: indeed, the first to be output are the m's with a value of 0 modulo $N_1$, then the m's with a value of 1 and so forth until the m's having a value of $N_1-1$ still with 0 modulo $N_1$; this order is called "bit reverse" because this corresponds to reversing the binary representation of the index in order to obtain the output rank (for a number of points to the 2nd power).

The performance of the inverse discrete Fourier transform, which retrieves the frequency data in bit reverse, is done in a dual manner, by reversing the operations (conjugation of twiddle factors, $N_1$ point fast IFFT followed by a $N_2$ point multiplexed IFFT).

$$X_{n_2 N_1 + n_1} \atop {0 \leq n_1 \leq N_1-1 \atop 0 \leq n_2 \leq N_2-1} = \sum_{n_2=0}^{N_2-1} \sum_{n_1=0}^{N_1-1} x_{m_2 N_2 + m_2} \times e^{-j2\pi \frac{(n_2 N_1 + n_1) \times (m_1 N_2 + m_2)}{N_1 N_2}} =$$

$$\sum_{m_2=0}^{N_2-1} e^{-j2\pi \frac{n_1 m_2}{N_2}} \times \underbrace{e^{j2\pi \frac{n_1 m_2}{N_1 N_2}}}_{\text{twiddle factors}} \times \underbrace{\sum_{m_1=0}^{N_1-1} x_{m_1 N_2 + m_2} e^{-j2\pi \frac{n_1 m_1}{N_1}}}_{N_1 \text{ point FFT (radix } N_1)}$$

$N_2$ point FFT multiplexed by $N_1$ (radix $N_2$)

The slow index of the $m_1$ frequencies arrives in the short time and the fast index of the $m_2$ frequencies arrives in the long time ("bit reverse").

The fast index of the time $n_1$ is output in the short time.

Thus, the performance takes place as the cascade of a $N_2$ point discrete Fourier transform multiplexed by $N_1$ and a nonmultiplexed $N_1$ point discrete Fourier transform. The twiddle factor is placed between the two stages of discrete Fourier transform. The first discrete Fourier transform done being multiplexed, this decomposition accommodates parallelized input data; the multiplexing then turns into parallel processing.

Furthermore, according to this conventional 2M point FFT embodiment, a decomposition into radix2 and radix M as an $a_n$ sequences is therefore written:

$$a_m = \sum_{n=0}^{2M-1} x_n e^{-j2\pi \frac{n \times m}{2M}} = \sum_{n=0}^{M-1} (x_n + (-1)^m x_{n+M}) e^{-j2\pi \frac{n \times m}{2M}} =$$

$$\sum_{n=0}^{M-1} x_n e^{-j2\pi \frac{n \times m}{2M}} + (-1)^m \sum_{n=0}^{M-1} x_{n+M} e^{-j2\pi \frac{n \times m}{2M}}$$

$$b_m = \sum_{n=0}^{2M-1} a_n e^{-j2\pi nm/(2M)} = \sum_{n=0}^{M-1} a_n e^{-j2\pi nm/(2M)} + (-1)^m \sum_{n=0}^{M-1} a_{M+n} e^{-j2\pi nm/(2M)}$$

In particular:

$$b_{2m+p} = \sum_{n=0}^{M-1} a_n e^{-j2\pi np/(2M)} e^{-j2\pi nm/M} + (-1)^p \sum_{n=0}^{M-1} a_{M+n} e^{-j2\pi np/(2M)} e^{-j2\pi nm/M}$$

Where $p = \begin{cases} 0 \\ 1 \end{cases}$

Be it:

$$b_{2m+p} = \text{FFT}_M(a_n e^{-j\pi np/M}) + (-1)^p \text{FFT}_M(a_{M+n} e^{-j\pi np/M})$$

where $\text{FFT}_M$ designates the M-point FFT.

It should be noted that this spectral density is also written in the following two ways, which will simplify the implementation thereof:

$$b_{2m+p} = \text{FFT}_M(a_n e^{-j\pi np/M}) + \text{FFT}_M(a_{M+n} e^{-j\pi(M+n)p/M})$$

and $$b_{2m+p} = \text{FFT}_M([(-1)^p a_n + a_{M+n}] e^{-j\pi(M+n)p/M})$$

By using $\rho_m$ to denote the spectral response of the filter, the response filtered by inverse transform is obtained:

$$c_k = \sum_{p=0}^{1} \sum_{m=0}^{M-1} b_{2m+p} \rho_{2m+p} e^{j2\pi k(2m+p)/(2M)} =$$

$$\sum_{p=0}^{1} e^{j2\pi kp/(2M)} \sum_{m=0}^{M-1} b_{2m+p} \rho_{2m+p} e^{j2\pi km/M}$$

The response is calculated only for the points $0 \leq k \leq M-1$ (due to the aliasing inherent to FFT) to ultimately obtain:

$$c_k = \sum_{p=0}^{1} e^{j\pi kp/M} \text{IFFT}_M(b_{2m+p} \rho_{2m+p})$$

where $\text{IFFT}_M$ designates the M-point inverse FFT.

From formulas giving $b_{2m+p}$ and $c_k$, it is possible to obtain the preceding block diagrams, which make it possible to perform convolutions with responses of twice the size by using the same size FFT and IFFT, with M-point storage.

One then obtains the block diagram of FIG. 6. Such a block diagram corresponds to the first formulation of the spectral density $b_{2m+p}$.

By sliding the storage function toward the output it can be cut in half, which leads to the block diagram of FIG. 7.

Lastly, the sliding of the storage toward the input, which in fact corresponds to the second formulation of the spectral density leads to the block diagram of FIG. 8, which can be considered a dual version of the block diagram of FIG. 7.

The operations involved in these block diagrams correspond to the first tier (for the FFT) or the tier rank (for the IFFT) of twiddle factors not taken into account, in principle, in the M-point FFT. Theoretically, these digital operations must be reset upon each FFT frame.

It must, however, be noted that this is in fact not necessary in practice because, without reset, the sign of these operations changes upon each frame, such that the two sign changes offset one another.

It can be demonstrated that such filtering is more economical in terms of memory resources in the case where floating-point implementation is required.

When the filtering corresponds to filtering adapted to a given signal (a received pulse, for example), the complex gain of the matched filter is the conjugate of the pulse spectrum. If this spectrum is obtained by FFT at 2M points of a pulse starting at n=0 and ending before n=M, then the temporal response of the matched filter is then placed in the negative time.

If $r_n$ is the pulse and if $x_n$ is the received signal, the matched filtering performs the following operation, which is the calculation of the autocorrelation of the pulse when the received signal $x_n$ is equal to the pulse $r_n$, the autocorrelation peak arriving at the beginning of the pulse:

$$y_q = \sum_{k=0}^{M-1} r_k^* x_{q+k}$$

The conjugate of the complex gain of the matched filter is:

$$\begin{cases} \rho_{2m}^* = \sum_{n=0}^{2M-1} r_n e^{-j2\pi n(2m)/(2M)} = \sum_{n=0}^{M-1} r_n e^{-j2\pi nm/M} + \sum_{n=0}^{M-1} r_{M+n} e^{-j2\pi nm/M} \\ \rho_{2m+1}^* = \sum_{n=0}^{2M-1} r_n e^{-j2\pi n(2m+1)/(2M)} = \sum_{n=0}^{M-1} r_n e^{-j2\pi n/(2M)} e^{j2\pi nm/M} - \sum_{n=0}^{M-1} r_{M+n} e^{-j2\pi n/(2M)} e^{-j2\pi nm/M} \end{cases}$$

Given that the pulse is zero for negative times, the result of two FFT at M points is then obtained:

$$\rho_{2m}^* = \sum_{n=0}^{M-1} r_n e^{-j2\pi nm/M}$$

$$\rho_{2m+1}^* = \sum_{n=0}^{M-1} r_n e^{-j\pi n/M} e^{-j2\pi nm/M}$$

This gives the verification block diagram of FIG. 9 a more symmetrical view that makes it possible to verify directly that each implementation of the second filter 100 indeed allows the achievement of the desired result.

At the input of the IFFT of the first channel 1001, the following is obtained:

$$\sum_{n=0}^{M-1} \xi_n e^{-j2\pi nm/M} \sum_{k=0}^{M-1} r_k^* e^{+j2\pi km/M} =$$

$$\sum_{n=0}^{M-1} \sum_{k=0}^{M-1} \xi_n r_k^* e^{-j2\pi(n-k)m/M} = \sum_{q=0}^{M-1} e^{-j2\pi qm/M} \sum_{n=0}^{M-1} \xi_n r_{mod(n-q,M)}^*$$

At the output of this IFFT of the first channel 1001, the following is obtained:

$$\sum_{n=0}^{M-1} \xi_n r_{mod(n-q,M)}^*$$

For the second channel 1002, at the input of the IFFT, the following is obtained:

$$\sum_{n=0}^{M-1} \xi_n e^{-j\pi n/M} e^{-j2\pi nm/M} \sum_{k=0}^{M-1} r_k^* e^{+j\pi k/M} e^{+j2\pi km/M} =$$

$$\sum_{k-n=-n}^{-n+M-1} \sum_{n=0}^{M-1} \xi_n r_k^* e^{-j\pi(n-k)/M} e^{-j2\pi(n-k)m/M}$$

These last equations are written as follows:

$$\sum_{n-k=n+1-M}^{n} \sum_{n=0}^{M-1} \xi_n r_k^* e^{-j\pi(n-k)/M} e^{-j2\pi(n-k)m/M} =$$

-continued $$\sum_{q=0}^{M-1} e^{-j\pi q/M} e^{-j2\pi qm/M} \sum_{n=0}^{M-1} \xi_n r_{mod(n-q,M)}^* \text{sign}(n-q)$$

where $\text{sign}(n-q) = \begin{cases} -1 \text{ if } n < q \\ +1 \text{ if } n \geq q \end{cases}$ Lastly, by way of remark, it should be noted that, for normalized IFFT (by NFFT, which leads to FFT*IFFT=1), one channel produces two times the impulse response. This should be taken into account in the coefficients, which should be divided by 2, except those of the FIR part. The execution of a normalized IFFT is obtained by carrying the normalization coefficient into the coefficients on top of the factor of 2 mentioned just before.

The comparison between the filters 18 of FIGS. 2 to 5 and the filters 100 of FIGS. 6 to 8 shows that functionally, the applied operations (even if they differ by the order and/or the nature of the operation) lead to the same result at the output.

The filters 18 of FIGS. 2 to 5 show a reduced latency relative to the filters proposed in FIGS. 6 to 8.

Figure 10:
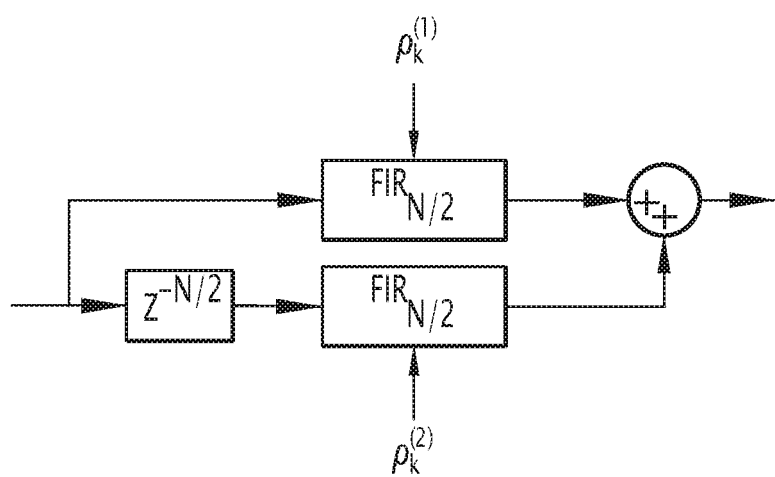

More specifically, the latency is reduced by half by applying the principle illustrated by the assembly of FIG. 10.

Such a principle is now described.

Reference $FIR_N$ denotes the execution of a FIR of maximum duration N according to the principle previously described. Such an execution therefore has latencies equal to 2N. The latency of a filter is, in this context, the additional delay of the filter relative to the theoretical filter performing the same filtering.

The function performed by the $FIR_N$ processing on a signal $x_k$ is as follows:

$$y_k = \sum_{n=0}^{N-1} a_n x_{k-n}$$

Such a function can be rewritten to show both complementary parts of duration N/2 in the time response of the FIR:

$$y_k = \sum_{n=0}^{-1+N/2} a_n x_{k-n} + \sum_{n=N/2}^{N-1} a_n x_{k-n} = \sum_{n=0}^{-1+N/2} a_n x_{k-n} + \sum_{n=0}^{-1+N/2} a_{n+N/2} x_{(k-N/2)-n}$$

Such an expression corresponds to the sum of the two responses, respectively first response and second response.

The first response can be interpreted as the filtering of the x's for the times k to k−(N/2−1) by the first part of the response of the FIR, while the second response can be interpreted as the filtering of the x's for the times k−N/2 to k−(N−1) by the second part of the response of the FIR.

Each of these two responses can then be done by a structure $FIR_{N/2}$ whereof the latency is N, as illustrated by the assembly of FIG. 10.

The application of this principle to the filters 50 of FIGS. 7 to 9 leads to the filters 18 of FIGS. 2 to 5.

The filter 18 therefore has a reduced latency. Such a filter will be denoted $FR_N$ hereinafter.

The generalization of such a principle leads to a method for filtering a numerical input signal sampled at a sampling frequency in order to obtain a filtered signal.

The method includes at least a step for supplying an input signal, a step for transmission of the input signal on two processing channels, a step for obtaining a first output signal, a step for obtaining a second output signal, a step for applying a Fourier transform and a recombination step.

During the step for obtaining the first output signal, a first output signal is obtained by carrying out first operations on the first processing channel, the first operations including at least the application of filtering involving a discrete Fourier transform at M/2 points on a signal coming from the input signal, the filtering having a latency of M.

During the step for obtaining the second output signal, second operations are carried out on the second processing channel, the second operations including at least the application of a shift by M/2 points to a signal coming from the input signal, then the application of filtering involving a discrete Fourier transform to M/2 points on the shifted signal, the filtering having a latency of M.

During the application step, an inverse discrete Fourier transform is applied to M/2 points on the first signal in order to obtain M points of the spectrum of the first signal, M being an integer strictly greater than 2.

During the recombination step, the results of two processing channels are recombined.

According to one particular example, the method includes an operation for addition of an input signal and of the input signal shifted by N/2 points, the signal obtained after addition being the input signal of the first processing channel.

According to another example or in addition, the method includes an operation for addition of an input signal and of the input signal shifted by N points, the signal obtained after addition being the input signal of the second processing channel.

According to still another example, the operation for shifting by N points is applied using two sub-units 40 and 42.

According to one example, the first operations include first processing of the input signal in order to obtain a processed signal, an operation for implementation of the step for application of a discrete Fourier transform to M points on the processed signal, each point of the spectrum of the processed signal corresponding to the even indices of a spectral analysis at 2*M points of the processed signal and being identified in a bijective manner by an index k, k being an even number inclusively between 0 and 2*M−1, second processing of the points of the spectrum of the processed signal in order to obtain the first selected points, an application of the inverse discrete Fourier transform to M points on the first selected points in order to obtain a first signal, and third processing of the first signal in order to obtain a first output signal.

According to another example, the second operations include first processing of the input signal in order to obtain a processed signal, an operation for implementation of the step for application of a discrete Fourier transform to M points on the processed signal, each point of the spectrum of the processed signal corresponding to the odd indices of a spectral analysis at 2*M points of the processed signal and being identified in a bijective manner by an index k, k being an even number inclusively between 0 and 2*M−1, second processing of the points of the spectrum of the processed signal in order to obtain the first selected points, an application of the inverse discrete Fourier transform to M points on the second selected points in order to obtain a first signal, and third processing of the second signal in order to obtain a first output signal.

The principle previously described can be generalized to obtain a cancellation of the latency.

The cancellation of the latency is then based on the following development:

$$N/2 + N/4 + \ldots + 2 + 1 = N - 1.$$

Figure 11:
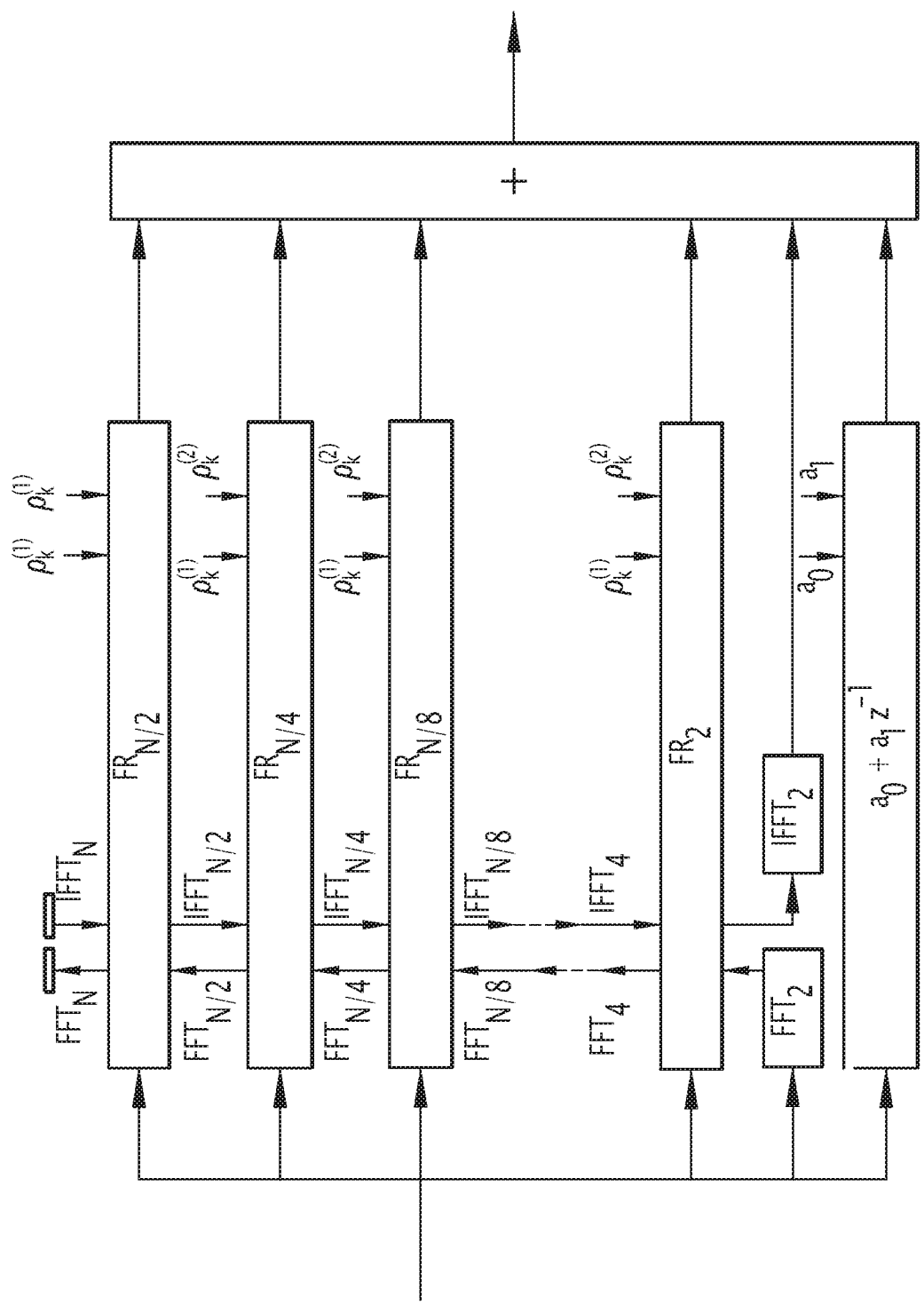

Since each structure $FR_N$ has an inherent latency equal to N, such a development makes it possible to propose an architecture with zero latency, as illustrated in FIG. 11.

The filter 18 of FIG. 11 includes a plurality of stages corresponding to each member of the development. The first stage corresponds to the FIG. 1, the second stage to the FIG. 2, ..., the $N/8^{th}$ stage to the figure N/8, the $N/4^{th}$ stage to the figure N/4 and the $N/2^{nd}$ stage to the figure N/2.

The filter 18 uses the capacity of a stage to carry out a FFT and an IFFT for the following stage.

In this FIG. 11, each $k^{th}$ channel $FR_k$ is formed by elements allowing the execution of a FIR with k coefficients delayed by k.

Figure 12:
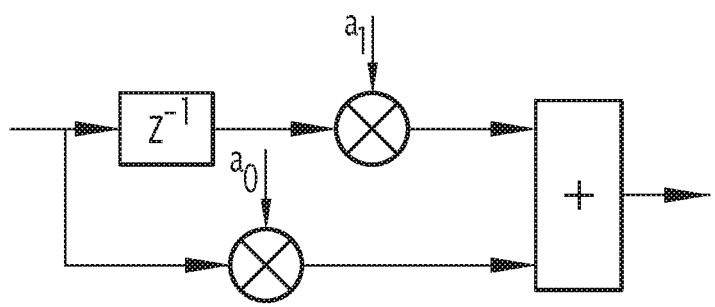

As an example, for the first stage, the box $FIR_1$ is produced by the FIR shown in FIG. 12.

More specifically, the $FIR_1$ includes an adder capable of adding a first channel with a box $z^{-1}$ followed by a mixer $a_1$ and a second channel including a mixer $a_2$, the inputs of the two channels being combined.

The $FIR_1$ can thus be designated as $a^0+a_1z^{-1}$.

In the case of low values of k, in particular for k=2 and k=4, or even for k=8 and k=16, it may be more relevant to replace the embodiment of FIGS. 11 and 12 with an embodiment consuming fewer computing resources for low values of k.

By definition, a value of k is low when k is less than 256.

Figure 13:
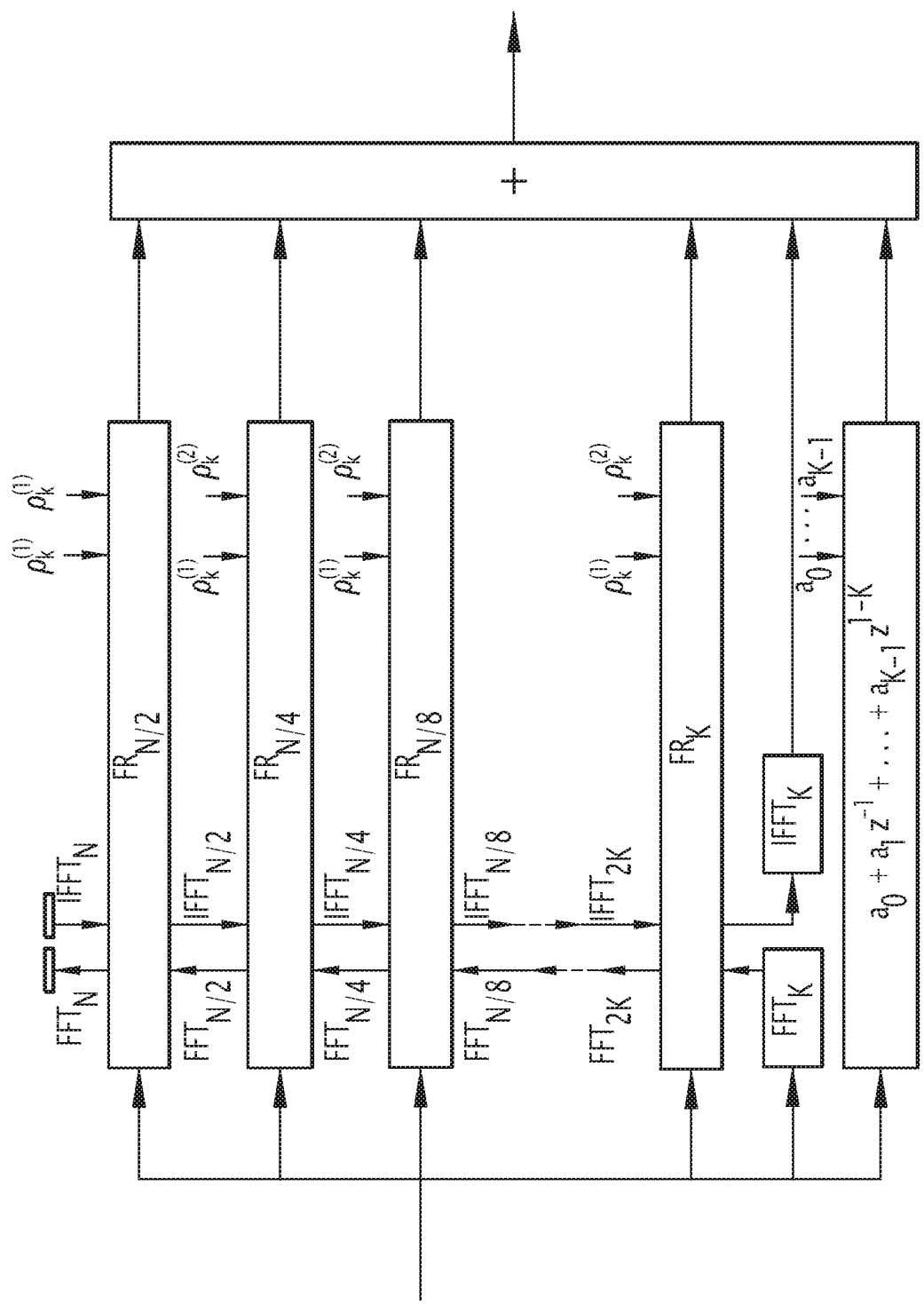
Figure 14:
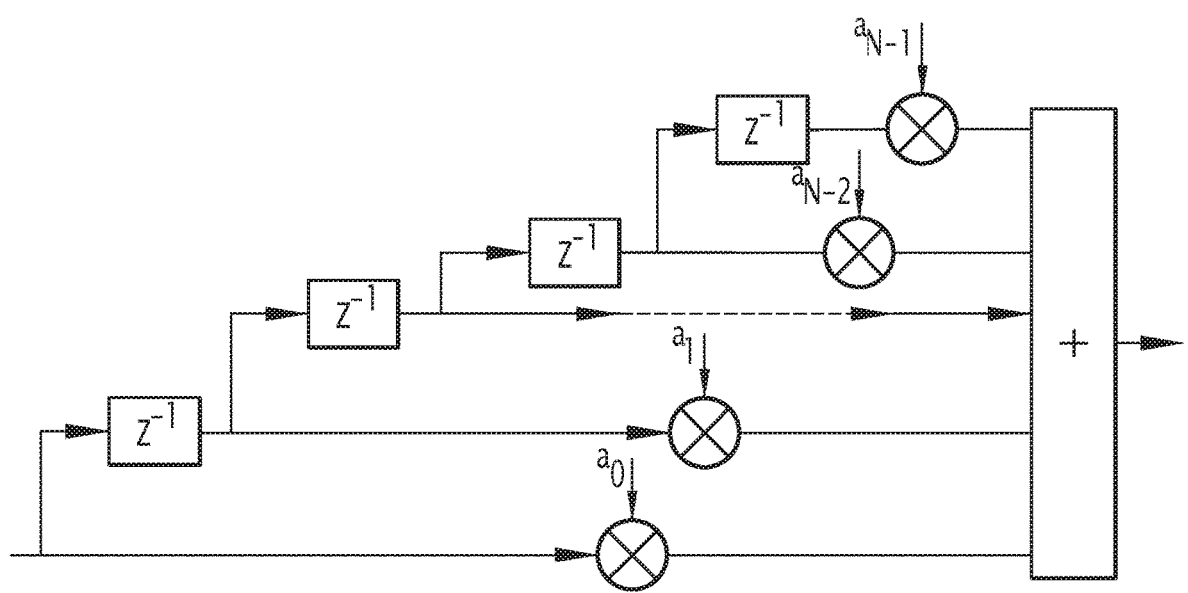

In such a case, the corresponding filter architecture 18 is that of FIG. 13.

The filter architecture 18 in particular differs from the first stage, the first stage including elements performing an operation $FR_K$. Such an operation is visible in FIG. 14.

Such a filter 18 makes it possible to obtain a zero latency by using complementary resources that will now be evaluated.

It should be recalled that a FFT operation or an IFFT operation of length $N=2^M$ requires the following resources, 2M additions and M/2 multiplications.

In the mathematical equations, it would be possible to use "ADD" to denote additions and "MUL" to denote multiplications.

As a result, a structure of type $FR_N$ then requires the following resources for the filter 18.

$$2\times(M-1)+6=2(M+2) \text{ additions, and}$$

$$2\times(M-1)/2+6=M+5 \text{ multiplications.}$$

In the case where the time response of the filter 18, with length $N=2^M$, is done in the form of FIR until the index $2^K-1$, the required resources include multiple elements.

In particular, the required resources involve 2 (M+1)+2 M+ . . . +2 (K+2) additions for the structures $FR_{2^K}$. 2×2K additions for the FFT and the IFFT at $2^K$ points and 2K−1 additions for the FIR part.

The resources required to carry out such a calculation also involve (M+4)+(M+3)++(K+5) multiplications for the $FR_k$ structures, 2×K/2 multiplications for the FFT and the IFFT at $2^K$ points and 2K multiplications for the FIR part.

This gives in all, for $N=2^M$:

$$\begin{cases} N_{ADD} = 2^K + 4K - 1 + 2\sum_{m=K+2}^{M+1} m = 2^K - 1 + 4K + (M-K)(M+K+3) \\ N_{MUL} = 2^K + K + \sum_{m=K+5}^{M+4} m = = 2^K + K + \frac{(M-K)(M+K+9)}{2} \end{cases}$$

The required resources also involve M−K+2 additions corresponding to the final adder such that the embodiment of FIG. 11 requires the following resources:

$$\begin{cases} N_{ADD} = 2^K - 1 + 12M + 4(M-K)(M+K+3) + (M-K+1) \\ N_{MUL} = 2^K + 3M + \frac{3(M-K)(M+K+7)}{2} \end{cases}$$

Such values must be compared to the values required by an execution with a conventional filter according to the state of the art.

$$\begin{cases} N_{ADD} = 2^M - 1 \\ N_{MUL} = 2^M \end{cases}$$

This makes it possible to obtain the following comparison table:

| M | Number of additions involved in the case: FIG. 11 | state of the art | Number of multiplications involved in the case FIG. 11 | state of the art |
|---|---|---|---|---|
| 4 | 6 | 15 | 25 | 16 |
| 5 | 67 | 31 | 52 | 32 |
| 6 | 136 | 63 | 82 | 64 |
| 7 | 213 | 127 | 115 | 126 |
| 8 | 298 | 255 | 151 | 256 |
| 9 | 391 | 511 | 190 | 512 |
| 10 | 492 | 1023 | 232 | 1024 |
| 11 | 601 | 2047 | 277 | 2048 |
| 12 | 718 | 4095 | 325 | 4096 |
| 13 | 843 | 8191 | 376 | 8192 |
| 14 | 978 | 16383 | 430 | 16384 |
| 15 | 1117 | 32767 | 487 | 32768 |
| 16 | 1266 | 65535 | 547 | 65536 |

It should be noted that a good compromise between ADD and MUL is found for K=6. It should be observed that, if the first 64 coefficients are therefore coded in conventional FIR, this technique is advantageous in terms of computing resources relative to the conventional FIR once the size of the response exceeds 64 (128 and more) for the multipliers and 256 (512 and more) for the adders. However, the difference is tolerable between 128 and 512 for the adders that are not large operators compared with the multipliers.

The proposed filter 18 thus has a zero latency.

The filter 18 is based in both cases on a nesting doll structure in which each nesting doll is a computing stage used for the FFT for one stage and the IFFT for another stage.

The filter 18 thus uses the latency advantageously to produce a delay ensuring a zero latency in the end for the total filtering performed.

From this principle, it is possible to derive a method for filtering a numerical input signal sampled at a sampling frequency in order to obtain a filtered signal, the method including at least a supply step, a transmission step, a step for obtaining a first output signal, a step for obtaining a second output signal and an application step.

During the supply step, an input signal is supplied.

During the transmission step, the input signal is transmitted over two processing channels.

In order to obtain the first output signal, the corresponding obtaining step comprises carrying out first operations on the first processing channel, the first operations including at least the application of a discrete Fourier transform to $M/2^p$ points on a signal coming from the input signal, the integer p being greater than or equal to 1.

Such an obtaining step corresponds to the use of a latency with value $M/2^p$ in order to generate a delay making it possible to use the FFT or IFFT calculations for another stage in a synchronized manner.

During the step for obtaining the second output signal, second operations are carried out on the second processing channel, the second operations including at least the application of a shift by M/2 points to a signal coming from the input signal, then the application of filtering involving a discrete Fourier transform to $M/2^p$ points on the shifted signal.

Such an obtaining step can be interpreted as the use of a latency with value $M/2^p$ in order to generate a delay making it possible to use the FFT or IFFT calculations for another stage in a synchronized manner.

During the application step, a discrete Fourier transform is applied to $M/2^p$ points on the first signal in order to obtain M points of the spectrum of the first signal, M being an integer strictly greater than 2, the application step being carried out by the addition of the results of two processing channels.

Preferably, the method, and in particular at least the application step, is carried out for a plurality of values of p.

In particular, between each iteration, the integer p increases by increments of 1.

According to one example, p is less than or equal to the integer $p_0$, the integer $p_0$ being an integer verifying $M/2^{p_0}=1$.

The first operations include a first processing of the input signal in order to obtain a processed signal, the signal coming from the input signal on which the discrete Fourier transform to M/2p points is applied being the processed signal, each point of the spectrum of the processed signal corresponding to the even indices of a spectral analysis at 2*M/2p points of the processed signal and being identified in a bijective manner by an index k, k being an even number between 0 and 2*M/2p-1. The first operations further include a second processing of the points of the spectrum of the processed signal in order to obtain first selected points, an application of the inverse discrete Fourier transform to M/2p points on the first selected points in order to obtain a first signal, and a third processing of the first signal in order to obtain a first output signal.

The second operations include a first processing of the input signal in order to obtain a processed signal, the signal coming from the input signal on which the discrete Fourier transform to M/2p points is applied being the processed signal, each point of the spectrum of the processed signal corresponding to the odd indices of a spectral analysis at 2*M points of the processed signal and being identified in a bijective manner by an index k, k being an even number between 0 and 2*M-1. The second operations further include a second processing of the points of the spectrum of the processed signal in order to obtain second selected points, an application of the inverse discrete Fourier transform to M/2p points on the second selected points in order to obtain a second signal, and a third processing of the second signal in order to obtain a second output signal.

The aforementioned filtering methods make it possible in each of the cases to obtain a zero latency.

In summary, when the lengths of the time responses of the filter of the FIR type are very large, the execution of the filtering becomes problematic, if not impossible, in light of the very large number of resources that this involves, especially if the FIR must be programmable.

In order to circumvent this problem, such an operation is performed in the spectrum. To this end, one goes from the time domain to the frequency domain by Fourier transform, the filtering operation then becoming multiplicative, then one returns to the time domain by inverse Fourier transform.

In so doing, for a time response length equal to N, these architectures in principle introduce a delay equal to 2N sampling periods relative to that of the response of the theoretical FIR. Such structures will be called base structure.

One of the proposed filters is derived from FFT and IFFT base structures. Schematically, the proposed structure consists of decomposing the time response of the FIR into segments of sizes 2, 2, 4, 8, 16, $2^{N-1}$, the sum of which is equal to $2^N$. In this decomposition, the longest segments correspond to the most delayed time domains of the time response.

Each segment is ensured by a substructure of latency equal to the duration of the response that the substructure ensures, such that its execution latency naturally introduces the delay associated with its position into the response.

The substructures are produced by the combination of two base structures of half size and shifted by their half-latency; this makes it possible to reduce the latency by half relative to the base structures.

The proposed architectures make it possible to address the inherent problem of latency of the base structures; owing to a strong optimization that exploits various decompositions of the FFT and the IFFT, it retains the characteristic of the initial architectures, with a base of FFT and IFFT, and requires few computing resources (despite a certain inflation relative to these initial architectures) while again having the characteristic of the conventional FIR architectures of not having latencies.

Owing to the reduction in resources that the aforementioned architectures allow, the proposed architecture allows the use of large FIR in any application requiring the smallest possible execution latencies.

The invention claimed is:

1. A method for filtering a numerical input signal sampled at a sampling frequency in order to obtain a filtered signal, the method including the steps of:
   supplying an input signal,
   transmitting the input signal over two processing channels,
   obtaining a first output signal by carrying out first operations on the first processing channel, the first operations including at least an application of a discrete Fourier transform to $M/2^p$ points on a signal coming from the input signal, p being an integer equal to or greater than 1 and an application of an inverse discrete Fourier transform to $M/2^p$ points on a signal in order to obtain M points of a spectrum of this signal, M being an integer greater than 2,
   obtaining a second output signal by carrying out second operations on the second processing channel, the second operations including at least an application of a shift by M/2 points to a signal coming from the input signal, then an application of filtering involving a discrete Fourier transform to $M/2^p$ points on the shifted signal, and
   adding the outputs of two processing channels;
   wherein the method includes carrying out at least the step for application of a plurality of values of p.

2. The method according to claim 1, wherein the integer p is less than or equal to an integer $p_0$, the integer $p_0$ being an integer verifying $M/2^{p_0}=1$.

3. The method according to claim 1, wherein the integer p increases by increments of 1.

4. The method according to claim 1, wherein the first operations include a first processing of the input signal in order to obtain a processed signal, the signal coming from the input signal on which the discrete Fourier transform to $M/2^p$ points is applied being the processed signal, each point of the spectrum of the processed signal corresponding to the even indices of a spectral analysis at $2*M/2^p$ points of the processed signal and being identified in a bijective manner by an index k, k being an even number between 0 and $2*M/2^p-1$, the first operations further including:
a second processing of the points of the spectrum of the processed signal in order to obtain first selected points,
an application of the inverse discrete Fourier transform to $M/2^p$ points on the first selected points in order to obtain a first signal, and
a third processing of the first signal in order to obtain a first output signal, and the second operations include a first processing of the input signal in order to obtain a processed signal, the signal coming from the input signal on which the discrete Fourier transform to $M/2^p$ points is applied being the processed signal, each point of the spectrum of the processed signal corresponding to the odd indices of a spectral analysis at $2*M/2^p$ points of the processed signal and being identified in a bijective manner by an index k, k being an even number between 0 and $2*M/2^p-1$, the second operations further including:
a second processing of the points of the spectrum of the processed signal in order to obtain second selected points,
an application of the inverse discrete Fourier transform to M points on the second selected points in order to obtain a second signal, and
a third processing of the second signal in order to obtain a second output signal.

5. A filter able to carry out the filtering method according to claim 1.

6. A processing chain comprising at least one filter according to claim 1.

7. The processing chain according to claim 6, the processing chain being made in the form of a programmable logic circuit or an application-specific integrated circuit.

8. A system including a processing chain according to claim 6.

* * * * *